(12) United States Patent
Son et al.

(10) Patent No.: US 12,144,234 B2
(45) Date of Patent: *Nov. 12, 2024

(54) DISPLAY DEVICE

(71) Applicant: Samsung Display Co., Ltd., Yongin-Si (KR)

(72) Inventors: Sewan Son, Yongin-si (KR); Moo Soon Ko, Seoul (KR); Ji Ryun Park, Cheonan-si (KR); Jin Sung An, Seongnam-si (KR); Min Woo Woo, Seoul (KR); Seong Jun Lee, Seoul (KR); Wang Woo Lee, Osan-si (KR); Jeong-Soo Lee, Hwaseong-si (KR); Ji Seon Lee, Hwaseong-si (KR); Deuk Myung Ji, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,301

(22) Filed: Sep. 30, 2022

(65) Prior Publication Data

US 2023/0028400 A1 Jan. 26, 2023

Related U.S. Application Data

(63) Continuation of application No. 17/000,402, filed on Aug. 24, 2020, now Pat. No. 11,489,024.

(30) Foreign Application Priority Data

Jan. 22, 2020 (KR) .................. 10-2020-0008639

(51) Int. Cl.
*H10K 59/88* (2023.01)
*H10K 59/12* (2023.01)

(52) U.S. Cl.
CPC ............. *H10K 59/88* (2023.02); *H10K 59/12* (2023.02); *H10K 59/1201* (2023.02)

(58) Field of Classification Search
CPC .... H10K 59/88; H10K 59/12; H10K 59/1201; H10K 59/123; H10K 59/1213;
(Continued)

(56) References Cited

U.S. PATENT DOCUMENTS 9,696,593 B2 7/2017 Kinoe et al.
11,489,024 B2 * 11/2022 Son ........................ H10K 59/88
(Continued)

FOREIGN PATENT DOCUMENTS

EP 0887695 A2 12/1998
EP 1670081 A2 6/2006
(Continued)

OTHER PUBLICATIONS

Extended European Search Report, Application No. 20193994.9 dated Feb. 15, 2021, 7 pages.

*Primary Examiner* — Michael M Trinh
(74) *Attorney, Agent, or Firm* — Innovation Counsel LLP

(57) ABSTRACT

A display device comprises a substrate including display and peripheral areas, a semiconductor element, a pixel structure, and a plurality of dummy patterns. The semiconductor element is disposed in the display area on the substrate, and the pixel structure is disposed on the semiconductor element. The dummy patterns which have stacked structure are disposed in the peripheral area on the substrate, and contain a material identical to a material constituting the semiconductor element. The dummy patterns are arranged in a grid shape in different layers, and each of the dummy patterns includes a central portion and an edge portion surrounding the central portion. The edge portions of dummy patterns which are adjacent to each other in the different layers (Continued)

among the dummy patterns are overlapped each other in a direction from the substrate to the pixel structure.

20 Claims, 19 Drawing Sheets

(58) Field of Classification Search
CPC ............... H10K 59/122; H10K 59/124; H10K 59/1214; H10K 59/35; H10K 59/1315; H01L 27/3223; H01L 27/3244; H01L 27/323
See application file for complete search history.

(56) References Cited

U.S. PATENT DOCUMENTS

| | | | |
|---|---|---|---|
| 2006/0124933 A1* | 6/2006 | Kang | H10K 71/18 |
| | | | 257/E27.113 |
| 2013/0258263 A1* | 10/2013 | Yasukawa | G02F 1/136286 |
| | | | 349/138 |
| 2014/0009702 A1* | 1/2014 | Kim | G02F 1/133512 |
| | | | 349/15 |
| 2015/0370107 A1* | 12/2015 | Kinoe | G02F 1/134336 |
| | | | 349/111 |
| 2016/0225907 A1 | 8/2016 | Kim et al. | |
| 2017/0110532 A1* | 4/2017 | Kim | H10K 50/8445 |
| 2019/0206952 A1* | 7/2019 | Lee | H10K 59/88 |
| 2021/0057460 A1* | 2/2021 | Park | H01L 21/32134 |
| 2021/0408205 A1 | 12/2021 | Lu et al. | |

FOREIGN PATENT DOCUMENTS

| | | |
|---|---|---|
| JP | 1996-067526 A | 3/1996 |
| JP | 1997-068718 A | 3/1997 |
| JP | 2003-289072 A | 10/2003 |
| JP | 2003-302916 A | 10/2003 |
| JP | 4512976 B2 | 7/2010 |
| JP | 2000-231113 A | 8/2020 |

* cited by examiner

DISPLAY DEVICE

CROSS-REFERENCE TO RELATED APPLICATION

This application is a continuation application of U.S. patent application Ser. No. 17/000,402 filed on Aug. 24, 2020, which claims priority under 35 USC § 119 to Korean Patent Application No. 10-2020-0008639 filed on Jan. 22, 2020 in the Korean Intellectual Property Office (KIPO), the disclosures of which are incorporated herein by reference.

BACKGROUND

1. Field

The present disclosure generally relates to a display device, and more particularly, to a display device including a plurality of dummy patterns.

2. Description of the Related Art

Flat panel display devices are used as display devices for replacing a cathode ray tube display device due to light-weight and thin characteristics thereof. As representative examples of such flat panel display devices, there are a liquid crystal display device and an organic light emitting diode display device.

The display device may include a display area and a peripheral area surrounding the display area. Semiconductor elements and pixel structures may be disposed in the display area, and wires, pad electrodes, and the like may be disposed in the peripheral area. When an active layer, a gate electrode (e.g., a pattern), and the like included in a semiconductor element are etched in a process of manufacturing a display device, sizes of the patterns (e.g., widths of the patterns) in a central part of the display area (e.g., a first area) and the display area which is adjacent to the peripheral area (e.g., a second area) may be different from each other. For example, since relatively many semiconductor elements are disposed in the first area, there may be relatively many etching target patterns in the first area, and since the second area is adjacent to the peripheral area, there may be relatively few etching target patterns in the second area. In other words, densities of the patterns in the first area and the second area may be different from each other, and the concentration of an etchant used to etch the patterns may be relatively low in the second area than in the first area. In this case, the size of the pattern formed in the second area may be relatively large, and the pattern may be shorted.

SUMMARY

The present disclosure provides a display device including a plurality of dummy patterns.

According to some example embodiments, a display device includes a substrate, a semiconductor element, a pixel structure, and a plurality of dummy patterns. The substrate has a display area and a peripheral area. The semiconductor element is disposed in the display area on the substrate. The pixel structure is disposed on the semiconductor element. The dummy patterns are disposed in the peripheral area on the substrate, and have a material identical to a material constituting the semiconductor element. The dummy patterns have a stacked structure. The dummy patterns are arranged in a grid shape in different layers, and each of the dummy patterns includes a central portion and an edge portion surrounding the central portion. The edge portions of dummy patterns which are adjacent to each other in the different layers among the dummy patterns are overlapped each other in a direction from the substrate to the pixel structure.

In exemplary embodiments, the central portions of the dummy patterns which are adjacent to each other in the different layers may not be overlapped each other.

In example embodiments, the display device may further include active patterns disposed between the dummy patterns and the substrate. The active patterns may be arranged in a grid shape, and may overlap at least a part of the dummy patterns.

In example embodiments, the dummy patterns may include reference dummy patterns, lower dummy patterns, intermediate dummy patterns, and upper dummy patterns. The reference dummy patterns may be spaced apart from each other at a first interval. The lower dummy patterns may be disposed on the reference dummy patterns, and may be spaced apart from each other at the first interval. The lower dummy patterns may overlap first, second, third, and fourth corner portions of each of the reference dummy patterns. The intermediate dummy patterns may be disposed on the lower dummy patterns, and may be spaced apart from each other at the first interval. The intermediate dummy patterns may overlap first and second side portions of each of the reference dummy patterns and first and second side portions of each of the lower dummy patterns. The upper dummy patterns may be disposed on the intermediate dummy patterns, and may be spaced apart from each other at the first interval. The upper dummy patterns may overlap third and fourth side portions of each of the reference dummy patterns, third and fourth side portions of each of the lower dummy patterns, and first, second, third, and fourth corner portions of each of the intermediate dummy patterns. In each of the reference dummy pattern and the lower dummy pattern, the first side portion may face the second side portion, and the third side portion may face the fourth side portion.

In example embodiments, the reference dummy patterns, the lower dummy patterns, the intermediate dummy patterns, and the upper dummy patterns may have a same shape.

In example embodiments, in each of the reference dummy patterns, both ends of the first side portion may include the first and second corner portions respectively, both ends of the second side portion may include the third and fourth corner portions respectively, both ends of the third side portion may include the first and third corner portions respectively, and both ends of the fourth side portion may include the second and fourth corner portions respectively.

In example embodiments, in each of the lower dummy patterns, both ends of the first side portion may include the first and third corner portions respectively, both ends of the second side portion may include the second and fourth corner portions respectively, both sides of the third side portion may include the first and second corner portions respectively, and both ends of the fourth side portion may include the third and fourth corner portions respectively.

In example embodiments, the display device may further include active patterns disposed between the reference dummy patterns and the substrate. The active patterns may be arranged in a grid shape while being spaced apart from each other at the first interval, and the active patterns may overlap the reference dummy patterns.

In example embodiments, the semiconductor element may include an active layer disposed on the substrate, a gate insulating layer disposed on the active layer, which covers the active layer, a first gate electrode disposed on the gate insulating layer, a first insulating interlayer disposed on the first gate electrode, which covers the first gate electrode, a second gate electrode disposed on the first insulating interlayer, a second insulating interlayer disposed on the second gate electrode, which covers the second gate electrode, a third gate electrode disposed on the second insulating interlayer, a third insulating interlayer disposed on the third gate electrode, which covers the third gate electrode, and source and drain electrodes, both disposed on the third insulating interlayer.

In example embodiments, the gate insulating layer may extend from the display area to the peripheral area on the substrate to cover the active patterns in the peripheral area on the substrate, and the first insulating interlayer may extend from the display area to the peripheral area on the gate insulating layer to cover the reference dummy patterns in the peripheral area on the gate insulating layer. The second insulating interlayer may extend from the display area to the peripheral area on the first insulating interlayer to cover the lower dummy patterns in the peripheral area on the first insulating interlayer, and the third insulating interlayer may extend from the display area to the peripheral area on the second insulating interlayer to cover the intermediate dummy patterns in the peripheral area on the second insulating interlayer.

In example embodiments, the active layer may be located on a same layer as the active pattern, and the first gate electrode may be located on a same layer as the reference dummy patterns. The second gate electrode may be located on a same layer as the lower dummy patterns. The third gate electrode may be located on a same layer as the intermediate dummy patterns. The source and drain electrodes may be located on a same layer as the upper dummy patterns.

In example embodiments, the dummy patterns may include first to nth reference dummy patterns (where n is an integer of 1 or more), first to mth lower dummy patterns (where m is an integer of 1 or more) disposed on the first to nth reference dummy patterns, first to qth intermediate dummy patterns (where q is an integer of 1 or more) disposed on the first to mth lower dummy patterns, and first to pth upper dummy patterns (where p is an integer of 1 or more) disposed on the first to qth intermediate dummy patterns. First, second, third, and fourth corner portions of a kth reference dummy pattern (where k is an integer between 1 and n) among the first to nth reference dummy patterns may overlap jth, (j+1)th, (j+2)th, and (j+3)th lower dummy patterns (where j is an integer between 1 and m) among the first to mth lower dummy patterns, hth and (h+1)th intermediate dummy patterns (where h is an integer between 1 and q) among the first to qth intermediate dummy patterns, and gth and (g+1)th upper dummy patterns (where g is an integer between 1 and p) among the first to pth upper dummy patterns.

In example embodiments, the gth upper dummy pattern may be located between the jth and (j+1)th lower dummy patterns, and the jth and (j+1)th lower dummy patterns and the gth upper dummy pattern may be located in a same row. The (g+1)th upper dummy pattern may be located between the (j+2)th and (j+3)th lower dummy patterns, and the (j+2)th and (j+3)th lower dummy patterns and the (g+1)th upper dummy pattern may be located in a same row. The kth reference dummy pattern may be located between the hth and (h+1)th intermediate dummy patterns, and the hth and (h+1)th intermediate dummy patterns and the kth reference dummy pattern may be located in a same row.

In example embodiments, the hth intermediate dummy pattern may be located between the jth and (j+2)th lower dummy patterns, and the jth and (j+2)th lower dummy patterns and the hth intermediate dummy pattern may be located in a same column. The kth reference dummy pattern may be located between the gth and (g+1)th upper dummy patterns, and the gth and (g+1)th upper dummy patterns and the kth reference dummy pattern may be located in a same column. The (h+1)th intermediate dummy pattern may be located between the (j+1)th and (j+3)th lower dummy patterns, and the (j+1)th and (j+3)th lower dummy patterns and the (h+1)th intermediate dummy pattern may be located in a same column.

In example embodiments, the jth, (j+1)th, (j+2)th, and (j+3)th lower dummy patterns, the hth and (h+1)th intermediate dummy patterns, and the gth and (g+1)th upper dummy patterns may surround the kth reference dummy pattern.

In example embodiments, first, second, third, and fourth corner portions of a (k+1)th reference dummy pattern located in a same row as the kth reference dummy pattern may overlap the (j+1)th and (j+3)th lower dummy patterns, (j+4)th and (j+5)th lower dummy patterns, the (h+1)th intermediate dummy pattern, an (h+2)th intermediate dummy pattern, and (g+2)th and (g+3)th upper dummy patterns.

In example embodiments, the (g+2)th upper dummy pattern may be located between the (j+1)th and (j+4)th lower dummy patterns, and the jth, (j+1)th, and (j+4)th lower dummy patterns and the gth and (g+2)th upper dummy patterns may be located in a same row. The (g+3)th upper dummy pattern may be located between the (j+3)th and (j+5)th lower dummy patterns, and the (j+2)th, (j+3)th, and (j+5)th lower dummy patterns and the (g+1)th and (g+3)th upper dummy patterns may be located in a same row. The (k+1)th reference dummy pattern may be located between the (h+1)th and (h+2)th intermediate dummy patterns, and the hth, (h+1)th, and (h+2)th intermediate dummy patterns and the kth and (k+1)th reference dummy patterns may be located in a same row.

In example embodiments, the (h+1)th intermediate dummy pattern may be located between the (j+1)th and (j+3)th lower dummy patterns, and the (j+1)th and (j+3)th lower dummy patterns and the (h+1)th intermediate dummy pattern may be located in a same column. The (k+1)th reference dummy pattern may be located between the (g+2)th and (g+3)th upper dummy patterns, and the (g+2)th and (g+3)th upper dummy patterns and the (k+1)th reference dummy pattern may be located in a same column. The (h+2)th intermediate dummy pattern may be located between the (j+4)th and (j+5)th lower dummy patterns, and the (j+4)th and (j+5)th lower dummy patterns and the (h+2)th intermediate dummy pattern may be located in a same column.

In example embodiments, the (j+1)th, (j+3)th, (j+4)th, and (j+5)th lower dummy patterns, the (h+1)th and (h+2)th intermediate dummy patterns, and the (g+2)th and (g+3)th upper dummy patterns may surround the (k+1)th reference dummy pattern.

In example embodiments, the display device may further include a planarization layer which covers the semiconductor element and the dummy patterns on the substrate. The pixel structure may include a lower electrode disposed in a display area on the planarization layer, a light emitting layer disposed on the lower electrode, and an upper electrode disposed on the light emitting layer. The lower electrode of the pixel structure is electrically connected to the drain electrode of the semiconductor element through a contact hole formed by removing a part of the planarization layer.

The display device according to the example embodiments of the present disclosure includes the active patterns and the dummy pattern structure which are disposed in the peripheral area adjacent to the display area, so that gaps of the gate insulating layer, the first insulating interlayer, the second insulating interlayer, and the third insulating interlayer may not be substantial. Accordingly, residues of the photoresist used in the process of etching each of the active patterns, the reference dummy patterns, the lower dummy patterns, the intermediate dummy patterns, and the upper dummy patterns may not be left, and the active layer, the first gate electrode, the second gate electrode, the third gate electrode, the source electrode, and the drain electrode, which are disposed in the display area, may not be shorted by the residues.

In the method of manufacturing the display device according to example embodiments of the present disclosure, the active patterns and the dummy pattern structure which are formed in the peripheral area adjacent to the display area have a waffle shape with a plurality of grooves, so that the gaps of the gate insulating layer, the first insulating interlayer, the second insulating interlayer, and the third insulating interlayer may not be substantial. Accordingly, residues of the photoresist used in the process of etching each of the active patterns, the reference dummy patterns, the lower dummy patterns, the intermediate dummy patterns, and the upper dummy patterns may not be left in the steps. Therefore, when the active layer, the first gate electrode, the second gate electrode, the third gate electrode, the source electrode, and the drain electrode are formed in the display area, a defect caused by the residues may not occur.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Figure 1:
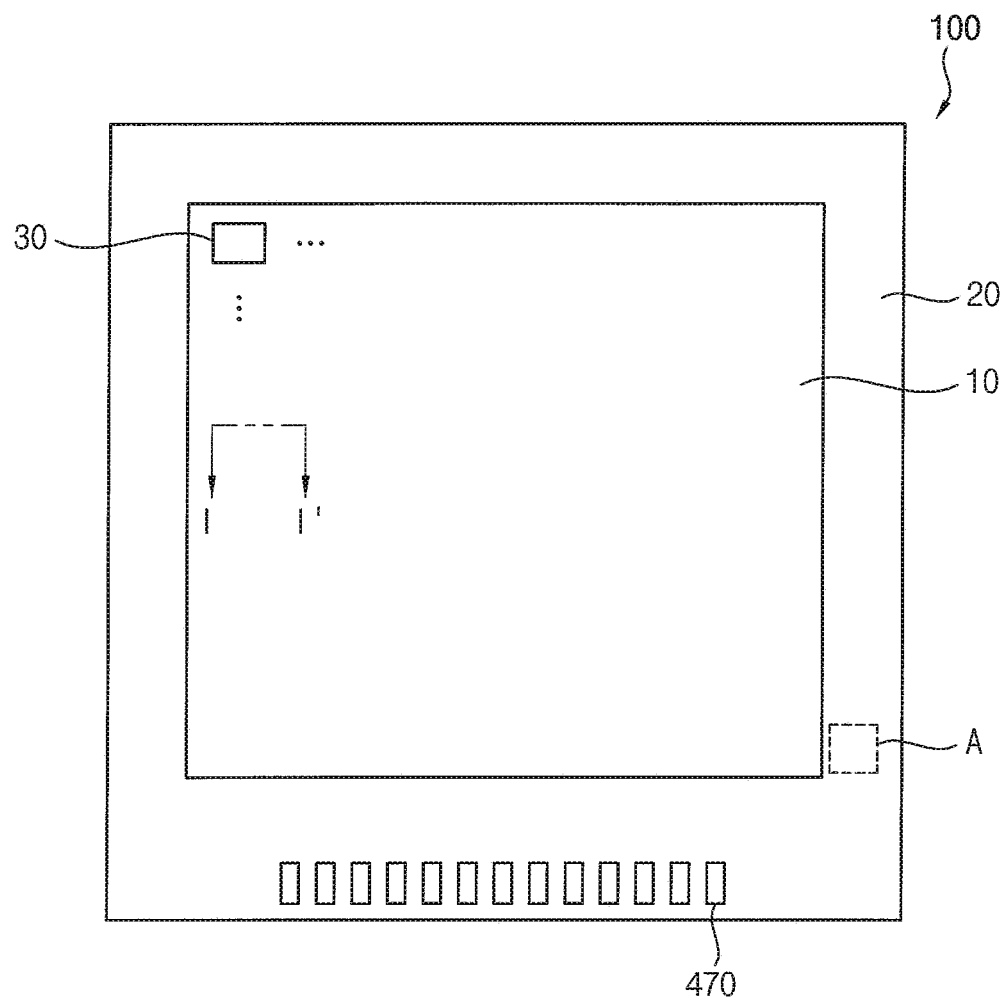
FIG. 1 is a top plan view showing a display device according to example embodiments of the present disclosure.

Hereinafter, a display device and a method of manufacturing a display device according to example embodiments of the present disclosure will be described in detail with reference to the accompanying drawings. In the accompanying drawings, same or similar reference numerals refer to the same or similar elements.

FIG. 1 is a top plan view showing a display device according to example embodiments of the present disclosure.

Referring to FIG. 1, a display device 100 may have a display area 10 and a peripheral area 20. In this case, the peripheral area 20 may substantially surround the display area 10 (or at least partially surround the display area 10), and a pad electrode 470 electrically connected to an external device that generates driving signals (e.g., a data signal, a gate signal, an emission control signal, a gate initialization signal, an initialization voltage, a power supply voltage, and the like) may be disposed on one side of the peripheral area 20. In addition, the display area 10 may include a plurality of pixel areas 30. For example, the peripheral area 20 may have a hollow rectangular shape when viewed in a top plan view. In other words, the peripheral area 20 may have a rectangular shape having an opening that exposes the display area 10 when viewed in a top plan view.

The pixel areas 30 may be arranged over the whole display area 10. For example, the pixel structure 200, the semiconductor element 250, and the like shown in FIG. 10 may be disposed in each of the pixel areas 30. The driving signals may be provided to the pixel structure 200 and the semiconductor element 250, and an image may be displayed on the display area 10 through the pixel structure 200 and the semiconductor element 250.

Although each of the display area 10 and the pixel area 30 according to the present disclosure has been described as having a rectangular shape when viewed in a top plan view, the configuration of the present disclosure is not limited. For example, each of the display area 10 and the pixel area 30 may have a triangular shape, a rhombic shape, a polygonal shape, a circular shape, a track shape, or an elliptical shape when viewed in a top plan view.

In addition, a plurality of wires may be disposed in the peripheral area 20. For example, the wires may include a data signal wire, a gate signal wire, an emission control signal wire, a gate initialization signal wire, an initialization voltage wire, and a power supply voltage wire. The wires may be connected to the pad electrode 470 in the peripheral area 20, and may extend from the peripheral area 20 to the display area 10 so as to be electrically connected to the pixel structure 200 and the semiconductor element 250. In other words, the driving signals may be transmitted to the pixel structure 200 and the semiconductor element 250 through the pad electrode 470 and the wires. Moreover, a gate driver, a data driver, and the like may be disposed in the peripheral area 20.

In example embodiments, active patterns 530 and dummy patterns 570, 575, 585, and 610 (e.g., a dummy pattern structure 500 of FIG. 10) showing in FIGS. 2, 3, 4, 5, 6, and 7 may be disposed in the peripheral area 20.

For example, when an active layer, a gate electrode (e.g., a pattern), and the like included in a semiconductor element are etched in a process of manufacturing a conventional display device, sizes of the patterns (e.g., widths of the patterns) in a central part of the display area (e.g., a first area) and the display area which is adjacent to the peripheral area (e.g., a second area) may be different from each other. For example, since many semiconductor elements are disposed in the first area, there may be many etching target patterns in the first area, and since the second area is adjacent to the peripheral area, there may be few etching target patterns in the second area. In other words, densities of the patterns in the first area and the second area may be different from each other, and the concentration of an etchant used to etch the patterns may be low in the second area than in the first area. For example, after a preliminary metal layer is formed over the whole of the display area and the peripheral area, a pattern may be formed by partially etching the preliminary metal layer, in which the pattern is not formed in the peripheral area, so that the concentration of the etchant may become relatively low in order to etch all the preliminary metal layer located in the peripheral area. In this case, the size of the pattern formed in the second area adjacent to the peripheral area may be relatively large, and the pattern may be shorted.

The display device 100 according to the example embodiments of the present disclosure may include the active patterns 530 and the dummy patterns 570, 575, 585, and 610 which are disposed in the peripheral area 20 adjacent to the display area 10. In this case, the active patterns 530 and the dummy patterns 570, 575, 585, and 610 disposed in the peripheral area 20 are simultaneously formed in a process of forming the semiconductor element 250 which is adjacent to the peripheral area 20, so that the concentration of the etchant may be substantially the same in the central part of the display area 10 and the display area 10 which is adjacent to the peripheral area 20. In other words, a distance between the semiconductor element 250, which is adjacent to the peripheral area 20, and the active patterns 530 and the dummy patterns 570, 575, 585, and 610, which are located in the peripheral area 20, may be determined in consideration of a distance between semiconductor elements 250 disposed in the central part of the display area 10. Accordingly, the semiconductor element 250 formed in the central part of the display area 10 and the semiconductor element 250 formed in the display area 10 which is adjacent to the peripheral area 20 may have substantially the same size, and the semiconductor element 250 formed in the display area 10 which is adjacent to the peripheral area 20 may not have a defect.

Although the active patterns 530 and the dummy patterns 570, 575, 585, and 610 according to the present disclosure have been shown as being disposed only at a periphery of 'A' region, the configuration of the present disclosure is not limited. For example, the active patterns 530 and the dummy patterns 570, 575, 585, and 610 may be formed over the whole peripheral area 20 to substantially surround the display area 10, or may be formed only in a portion of the peripheral area 20 which is adjacent to a portion where a difference in the concentration of the etchant occurs.

Figure 2:
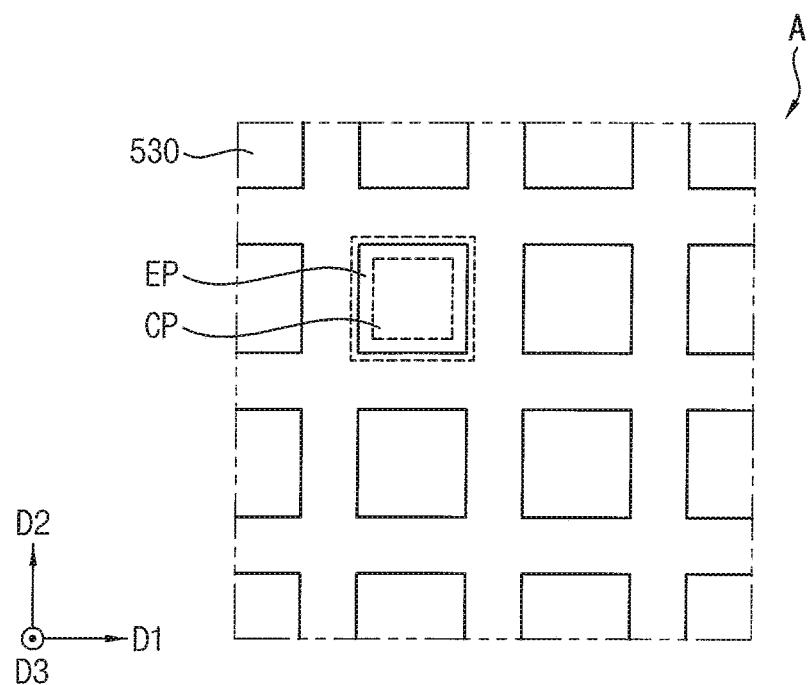
FIGS. 2, 3, 4, 5, 6 and 7 are partially enlarged top plan views showing 'A' region of FIG. 1.
Figure 3:
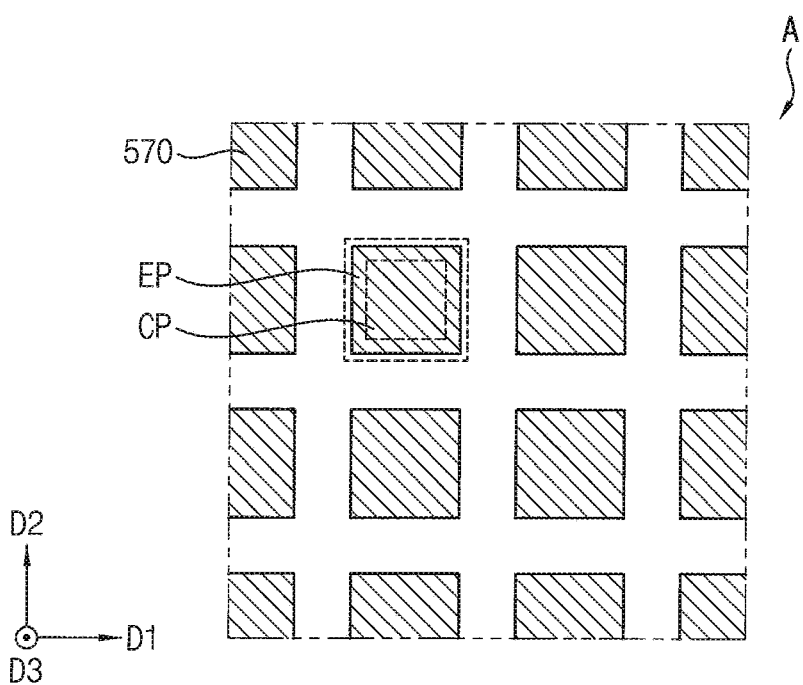
Figure 4:
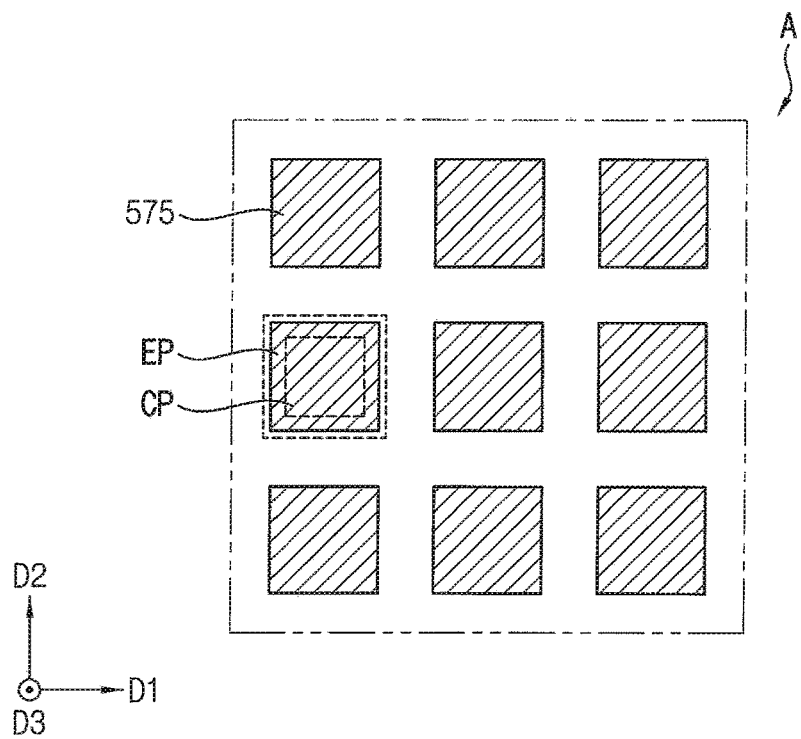
Figure 5:
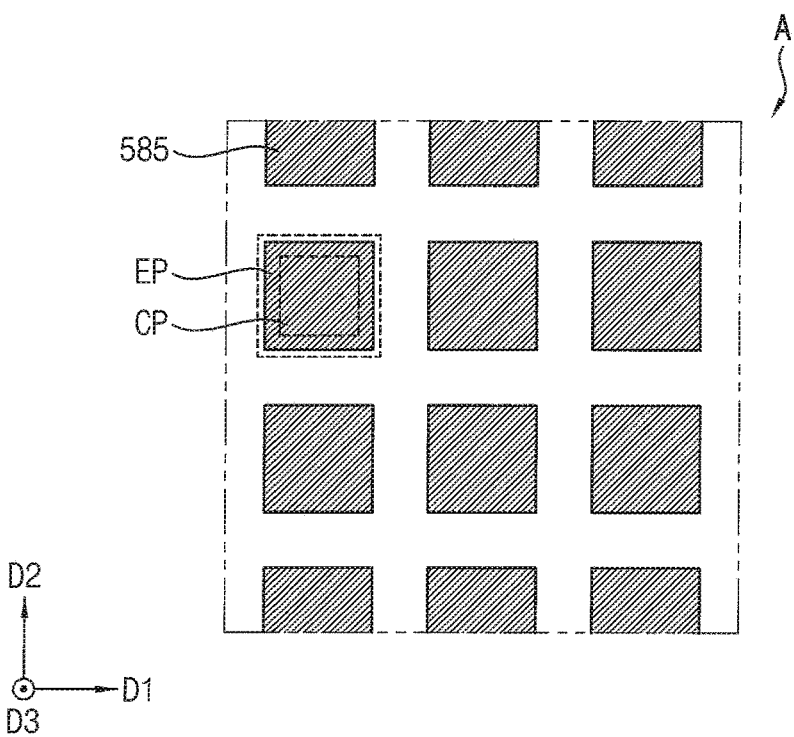
Figure 6:
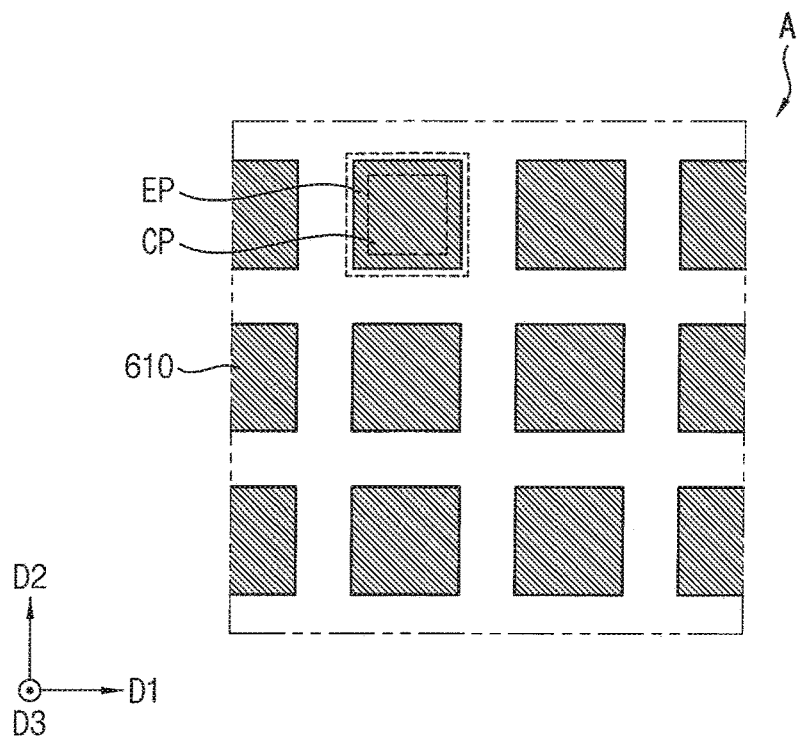
Figure 7:
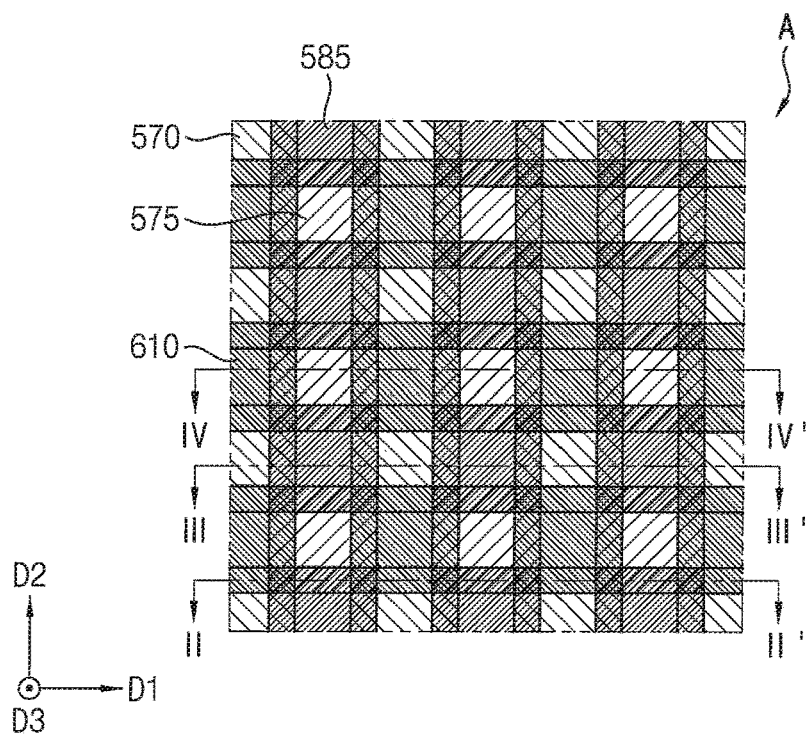
Figure 8:
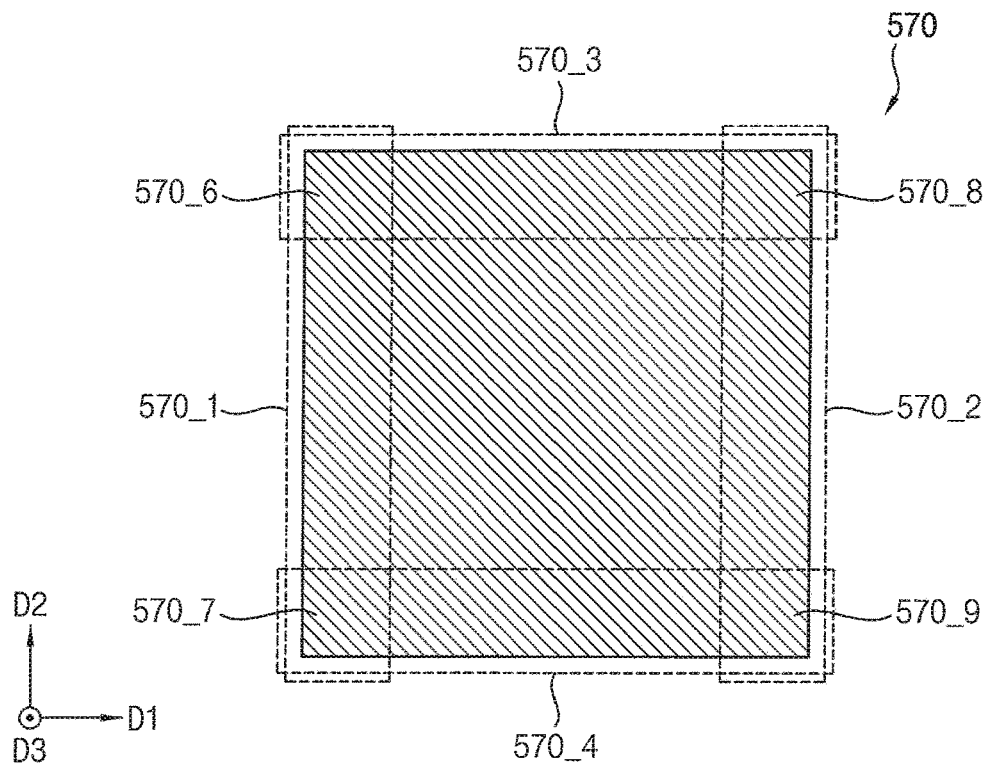
FIG. 8 is a top plan view for describing a reference dummy pattern included in the display device of FIG. 1.
Figure 9:
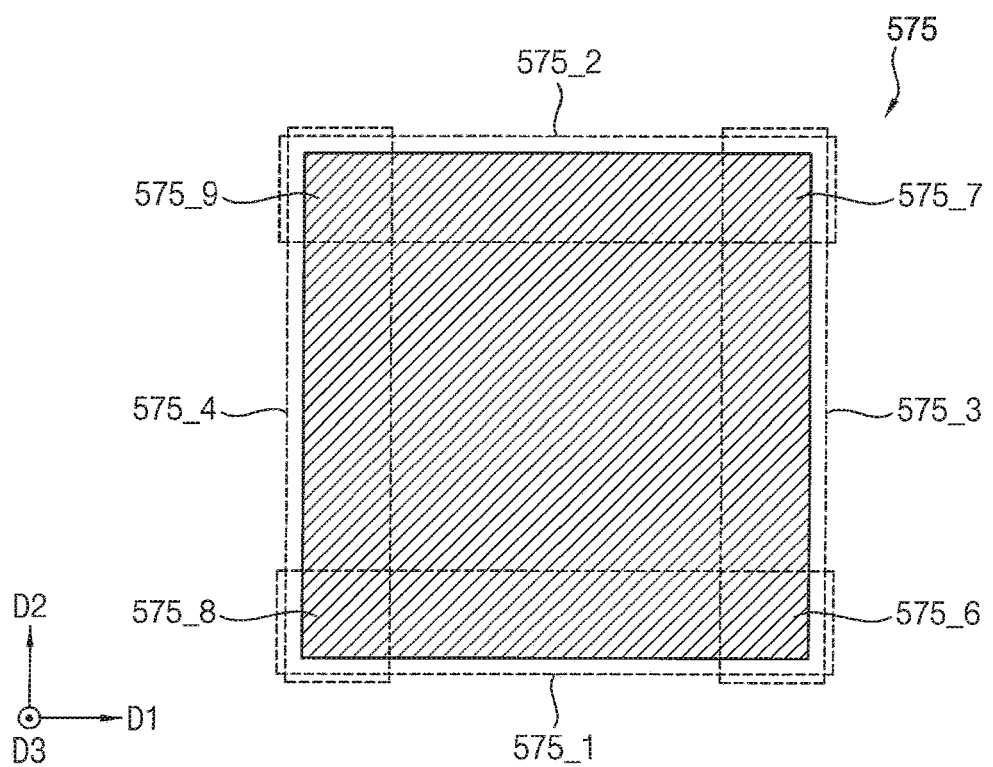
FIG. 9 is a top plan view for describing a lower dummy pattern included in the display device of FIG. 1.

FIGS. 2, 3, 4, 5, 6 and 7 are partially enlarged top plan views showing 'A' region of FIG. 1, FIG. 8 is a top plan view for describing a reference dummy pattern included in the display device of FIG. 1, and FIG. 9 is a top plan view for describing a lower dummy pattern included in the display device of FIG. 1. For example, the display device 100 may include the active patterns 530 and the dummy patterns 570, 575, 585, and 610, which have a stacked structure, and the dummy patterns 570, 575, 585, and 610 may be classified into reference dummy patterns 570, lower dummy patterns 575, intermediate dummy patterns 585, and upper dummy patterns 610. In addition, FIG. 2 is a top plan view showing active patterns 530 arranged in 'A' region, FIG. 3 is a top plan view showing reference dummy patterns 570 arranged in 'A' region, FIG. 4 is a top plan view showing lower dummy patterns 575 arranged in 'A' region, FIG. 5 is a top plan view showing intermediate dummy patterns 585 arranged in 'A' region, FIG. 6 is a top plan view showing upper dummy patterns 610 arranged in 'A' region, and FIG. 7 is a top plan view showing the active patterns 530, the reference dummy patterns 570, the lower dummy patterns 575, the intermediate dummy patterns 585, and the upper dummy patterns 610 together.

Figure 10:
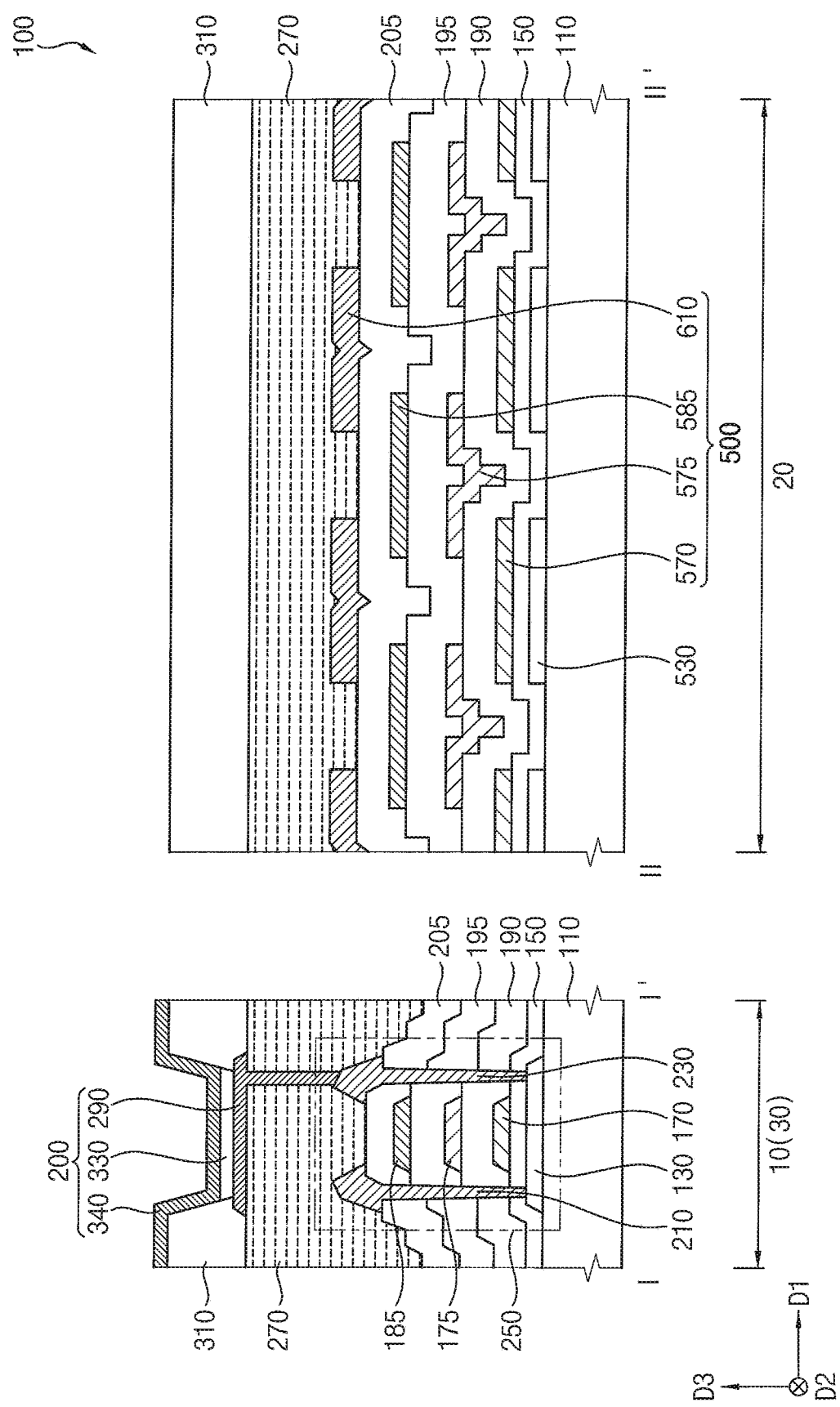
FIG. 10 is a sectional view taken along line I-I' of FIG. 1 and line II-II' of FIG. 7.

Referring to FIG. 2, the display device 100 may further include a substrate 110 shown in FIG. 10, the active patterns 530 may be arranged in a grid shape in the peripheral area 20 on the substrate 110. In other words, each of the active patterns 530 may be spaced apart from each other at a first interval in a first direction D1 parallel to a top surface of the substrate 110 in the peripheral area 20 on the substrate 110 and a second direction D2 perpendicular to the first direction D1.

Referring to FIGS. 3, 7, and 8, the reference dummy patterns 570 may be disposed on the active patterns 530. The reference dummy patterns 570 may be arranged in a grid shape on the active patterns 530. In other words, each of the reference dummy patterns 570 may be spaced apart from each other at the first interval in the first direction D1 and the second direction D2. In the example embodiments, each of the reference dummy patterns 570 may overlap each of the active patterns 530 respectively, and the active patterns 530 and the reference dummy patterns 570 may have substantially the same shape.

As shown in FIG. 8, each of the reference dummy patterns 570 may have a first side portion 570_1, a second side portion 570_2, a third side portion 570_3, and a fourth side portion 570_4. For example, in one of the reference dummy patterns 570, the first side portion 570_1 may be located on a left side, the second side portion 570_2 may be located on a right side, the third side portion 5703 may be located on an upper side, and the fourth side portion 570_4 may be located on a lower side. In other words, the first side portion 570_1 and the second side portion 570_2 may face each other along the first direction D1, and the third side portion 570_3 and the fourth side portion 570_4 may face each other along the second direction D2. In addition, both ends of the first side portion 5701 may include a first corner portion 570_6 and a second corner portion 570_7 respectively, both ends of the second side portion 5702 may include as a third corner portion 570_8 and a fourth corner portion 570_9 respectively, both ends of the third side portion 5703 may include as the first corner portion 570_6 and the third corner portion 5708 respectively, and both ends of the fourth side portion 570_4 may include as the second corner portion 570_7 and the fourth corner portion 570_9 respectively. In other words, a portion where the first side portion 570_1 and the third side portion 570_3 overlap each other may be defined as the first corner portion 5706, a portion where the first side portion 570_1 and the fourth side portion 570_4 overlap each other may be defined as the second corner portion 5707, a portion where the second side portion 570_2 and the third side portion 570_3 overlap each other may be defined as the third corner portion 5708, and a portion where the second side portion 570_2 and the fourth side portion 570_4 overlap each other may be defined as the fourth corner portion 570_9.

Referring to FIGS. 4, 7, and 9, the lower dummy patterns 575 may be disposed on the reference dummy patterns 570. The lower dummy patterns 575 may be arranged in a grid shape on the reference dummy patterns 570. In other words, the lower dummy patterns 575 may be spaced apart at the first interval in the first direction D1 and the second direction D2. In the example embodiments, the lower dummy patterns 575 may overlap the first corner portion 5706, the second corner portion 5707, the third corner portion 5708, and the fourth corner portion 570_9 of each of the reference dummy patterns 570. The active patterns 530, the reference dummy patterns 570, and the lower dummy patterns 575 may have substantially the same shape.

As shown in FIG. 9, each of the lower dummy patterns 575 may have a first side portion 575_1, a second side portion 575_2, a third side portion 575_3, and a fourth side portion 575_4. For example, in one of the lower dummy patterns 575, the first side portion 575_1 may be located on a lower side, the second side portion 575_2 may be located on an upper side, the third side portion 575_3 may be located on a right side, and the fourth side portion 575_4 may be located on a left side. In other words, the first side portion 575_1 and the second side portion 575_2 may face each other along the second direction D2, and the third side portion 575_3 and the fourth side portion 5754 may face each other along the first direction D1. In addition, both ends of the first side portion 575_1 may include a first corner portion 575_6 and a third corner portion 575_8 respectively, both ends of the second side portion 5752 may include a second corner portion 575_7 and a fourth corner portion 575_9 respectively, both ends of the third side portion 575_3 may include the first corner portion 575_6 and the second corner portion 575_7 respectively, and both ends of the fourth side portion 5754 may include the third corner portion 575_8 and the fourth corner portion 575_9 respectively. In other words, a portion where the first side portion 575_1 and the third side portion 575_3 overlap each other may be defined as the first corner portion 575_6, a portion where the first side portion 575_1 and the fourth side portion 575_4 overlap each other may be defined as the third corner portion 575_8, a portion where the second side portion 575_2 and the third side portion 575_3 overlap each other may be defined as the second corner portion 5757, and a portion where the second side portion 575_2 and the fourth side portion 575_4 overlap each other may be defined as the fourth corner portion 575_9.

In the example embodiments, one reference dummy pattern 570 may be adjacent to the four lower dummy patterns 575. In addition, when the adjacent four lower dummy patterns 575 are defined as first to fourth lower dummy patterns 575, the first corner portion 575_6 of the first lower dummy pattern 575 and the first corner portion 570_6 of the one reference dummy pattern 570 may overlap each other, the second corner portion 575_7 of the second lower dummy pattern 575 and the second corner portion 570_7 of the one reference dummy pattern 570 may overlap each other, the third corner portion 575_8 of the third lower dummy pattern 575 and the third corner portion 570_8 of the one reference dummy pattern 570 may overlap each other, and the fourth corner portion 575_9 of the fourth lower dummy pattern 575 and the fourth corner portion 570_9 of the one reference dummy pattern 570 may overlap each other.

Referring to FIGS. 5 and 7, the intermediate dummy patterns 585 may be disposed on the lower dummy patterns 575. The intermediate dummy patterns 585 may be arranged in a grid shape on the lower dummy patterns 575. In other words, the intermediate dummy patterns 585 may be spaced apart at the first interval in the first direction D1 and the second direction D2. In the example embodiments, the intermediate dummy patterns 585 may overlap the first and second side portions 570_1 and 570_2 of each of the reference dummy patterns 570, and the first and second side portions 575_1 and 575_2 of each of the lower dummy patterns 575. The active patterns 530, the reference dummy patterns 570, the lower dummy patterns 575, and the intermediate dummy patterns 585 may have substantially the same shape.

In the example embodiments, one reference dummy pattern 570 may be adjacent to two intermediate dummy patterns 585. In addition, when the adjacent two intermediate dummy patterns 585 are defined as first and second intermediate dummy patterns 585, the first intermediate dummy pattern 585 may simultaneously overlap the first side portion 575_1 of the first lower dummy pattern 575, the first side portion 570_1 of the one reference dummy pattern 570, and the second side portion 575_2 of the third lower dummy pattern 575, and the second intermediate dummy pattern 585 may simultaneously overlap the first side portion 575_1 of the third lower dummy pattern 575, the second side portion 570_2 of the one reference dummy pattern 570, and the fourth side portion 575_4 of the third lower dummy pattern 575.

In this case, a portion where the first intermediate dummy pattern 585 overlap the first corner portion 570_6 of the one reference dummy pattern 570 and the first corner portion 575_6 of the first lower dummy pattern 575 may be defined as a first corner portion of the first intermediate dummy pattern 585, a portion where the first intermediate dummy pattern 585 overlap the second corner portion 570_7 of the one reference dummy pattern 570 and the second corner portion 575_7 of the second lower dummy pattern 575 may be defined as a second corner portion of the first intermediate dummy pattern 585, a portion where the second intermediate dummy pattern 585 overlap the third corner portion 570_8 of the one reference dummy pattern 570 and the third corner portion 575_8 of the third lower dummy pattern 575 may be defined as a third corner portion of the second intermediate dummy pattern 585, and a portion where the second intermediate dummy pattern 585 overlap the fourth corner portion 570_9 of the one reference dummy pattern 570 and the fourth corner portion 575_9 of the fourth lower dummy pattern 575 may be defined as a fourth corner portion of the second intermediate dummy pattern 585.

Referring to FIGS. 6 and 7, the upper dummy patterns 610 may be disposed on the intermediate dummy patterns 585. The upper dummy patterns 610 may be arranged in a grid shape on the intermediate dummy patterns 585. In other words, the upper dummy patterns 610 may be spaced apart at the first interval in the first direction D1 and the second direction D2. In the example embodiments, the upper dummy patterns 610 may overlap the third and fourth side portions 570_3 and 570_4 of each of the reference dummy patterns 570, the third and fourth side portions 575_3 and 575_4 of each of the lower dummy patterns 575, and the first to fourth corner portions of each of the intermediate dummy patterns 585. The active patterns 530, the reference dummy patterns 570, the lower dummy patterns 575, the intermediate dummy patterns 585, and the upper dummy patterns 610 may have substantially the same shape.

In the example embodiments, one reference dummy pattern 570 may be adjacent to the two upper dummy patterns 610. In addition, when the adjacent two upper dummy patterns 610 are defined as first and second upper dummy patterns 610, the first upper dummy pattern 610 may simultaneously overlap the third side portion 575_3 of the first lower dummy pattern 575, the third side portion 570_3 of the one reference dummy pattern 570, the fourth side portion 575_4 of the third lower dummy pattern 575, the first corner portion of the first intermediate dummy pattern 585, and the third corner portion of the second intermediate dummy pattern 585, and the second upper dummy pattern 610 may simultaneously overlap the third side portion 575_3 of the second lower dummy pattern 575, the fourth side portion 570_4 of the one reference dummy pattern 570, the fourth side portion 575_4 of the fourth lower dummy pattern 575, the second corner portion of the first intermediate dummy pattern 585, and the fourth corner portion of the second intermediate dummy pattern 585.

In other words, the dummy patterns 570, 575, 585, and 610 may include first to $n^{th}$ reference dummy patterns 570 (where n is an integer of 1 or more), first to $m^{th}$ lower dummy patterns 575 (where m is an integer of 1 or more) disposed on the first to $n^{th}$ reference dummy patterns 570, first to $q^{th}$ intermediate dummy patterns 585 (where q is an integer of 1 or more) disposed on the first to $m^{th}$ lower dummy patterns 575, and first to $p^{th}$ upper dummy patterns 610 (where p is an integer of 1 or more) disposed on the first to $q^{th}$ intermediate dummy patterns 585.

First to fourth corner portions of a $k^{th}$ reference dummy patterns 570 (where k is an integer between 1 and n) among the first to $n^{th}$ reference dummy patterns 570 may overlap $j^{th}$, $(j+1)^{th}$, $(j+2)^{th}$, and $(j+3)^{th}$ lower dummy patterns 575 (where j is an integer between 1 and m) among the first to $m^{th}$ lower dummy patterns 575, $h^{th}$ and $(h+1)^{th}$ intermediate dummy patterns 585 (where h is an integer between 1 and q) among the first to $q^{th}$ intermediate dummy patterns 585, and $g^{th}$ and $(g+1)^{th}$ upper dummy patterns 610 (where g is an integer between 1 and p) among the first to $p^{th}$ upper dummy patterns 610.

The $g^{th}$ upper dummy pattern 610 may be located between the $j^{th}$ and $(j+1)^{th}$ lower dummy patterns 575, and the $j^{th}$ and $(j+1)^{th}$ lower dummy patterns 575 and the $g^{th}$ upper dummy pattern 610 may be located in the same row; the $(g+1)^{th}$ upper dummy pattern 610 may be located between the $(j+2)^{th}$ and $(j+3)^{th}$ lower dummy patterns 575, and the $(j+2)^{th}$ and $(j+3)^{th}$ lower dummy patterns 575 and the $(g+1)^{th}$ upper dummy patterns 610 may be located in the same row; and the $k^{th}$ reference dummy pattern 570 may be located between the $h^{th}$ and $(h+1)^{th}$ intermediate dummy patterns 585, and the $h^{th}$ and $(h+1)^{th}$ intermediate dummy patterns 585 and the $k^{th}$ reference dummy pattern 570 may be located in the same row.

The $h^{th}$ intermediate dummy pattern 585 may be located between the $j^{th}$ and $(j+2)^{th}$ lower dummy patterns 575, and the $j^{th}$ and $(j+2)^{th}$ lower dummy patterns 575 and the $h^{th}$ intermediate dummy pattern 585 may be located in the same column; the $k^{th}$ reference dummy pattern 570 may be located between the $g^{th}$ and $(g+1)^{th}$ upper dummy patterns 610, and the $g^{th}$ and $(g+1)^{th}$ upper dummy patterns 610 and the $k^{th}$ reference dummy pattern 570 may be located in the same column; and the $(h+1)^{th}$ intermediate dummy pattern 585 may be located between the $(j+1)^{th}$ and $(j+3)^{th}$ lower dummy patterns 575, and the $(j+1)^{th}$ and $(j+3)^{th}$ lower dummy patterns 575 and the $(h+1)^{th}$ intermediate dummy pattern 585 may be located in the same column.

The $j^{th}$, $(j+1)^{th}$, $(j+2)^{th}$, and $(j+3)^{th}$ lower dummy patterns 575, the $h^{th}$ and $(h+1)^{th}$ intermediate dummy patterns 585, and the $g^{th}$ and $(g+1)^{th}$ upper dummy patterns 610 may surround the $k^{th}$ reference dummy pattern 575.

First to fourth corner portions of a $(k+1)^{th}$ reference dummy pattern 570 located in the same row as the $k^{th}$ reference dummy pattern 570 may overlap the $(j+1)^{th}$ and $(j+3)^{th}$ lower dummy patterns 575, $(j+4)^{th}$ and $(j+5)^{th}$ lower dummy patterns 575, the $(h+1)^{th}$ intermediate dummy pattern 585, an $(h+2)^{th}$ intermediate dummy pattern 585, and $(g+2)^{th}$ and $(g+3)^{th}$ upper dummy patterns 610.

The $(g+2)^{th}$ upper dummy pattern 610 may be located between the $(j+1)^{th}$ and $(j+4)^{th}$ lower dummy patterns 575, and the $j^{th}$, $(j+1)^{th}$, and $(j+4)^{th}$ lower dummy patterns 575 and the $g^{th}$ and $(g+2)^{th}$ upper dummy patterns 610 may be located in the same row, the $(g+3)^{th}$ upper dummy pattern 610 may be located between the $(j+3)^{th}$ and $(j+5)^{th}$ lower dummy patterns 575, and the $(j+2)^{th}$, $(j+3)^{th}$, and $(j+5)^{th}$ lower dummy patterns 575 and the $(g+1)^{th}$ and $(g+3)^{th}$ upper dummy patterns 610 may be located in the same row, and the $(k+1)^{th}$ reference dummy pattern 570 may be located between the $(h+1)^{th}$ and $(h+2)^{th}$ intermediate dummy patterns 585. The $h^{th}$, $(h+1)^{th}$, and $(h+2)^{th}$ intermediate dummy patterns 585 and the $k^{th}$ and $(k+1)^{th}$ reference dummy patterns 570 may be located in the same row.

The $(h+1)^{th}$ intermediate dummy pattern 585 may be located between the $(j+1)^{th}$ and $(j+3)^{th}$ lower dummy patterns 575, and the $(j+1)^{th}$ and $(j+3)^{th}$ lower dummy patterns 575 and the $(h+1)^{th}$ intermediate dummy pattern 585 may be located in the same column, the $(k+1)^{th}$ reference dummy pattern 570 may be located between the $(g+2)^{th}$ and $(g+3)^{th}$ upper dummy patterns 610, and the $(g+2)^{th}$ and $(g+3)^{th}$ upper dummy patterns 610 and the $(k+1)^{th}$ reference dummy pattern 570 may be located in the same column, and the $(h+2)^{th}$ intermediate dummy pattern 585 may be located between the $(j+4)^{th}$ and $(j+5)^{th}$ lower dummy patterns 575. The $(j+4)^{th}$ and $(j+5)^{th}$ lower dummy patterns 575 and the $(h+2)^{th}$ intermediate dummy pattern 585 may be located in the same column.

The $(j+1)^{th}$, $(j+3)^{th}$, $(j+4)^{th}$, and $(j+5)^{th}$ lower dummy patterns 575, the $(h+1)^{th}$ and $(h+2)^{th}$ intermediate dummy patterns 585, and the $(g+2)^{th}$ and $(g+3)^{th}$ upper dummy patterns 610 may surround the $(k+1)^{th}$ reference dummy pattern 570.

As described above, the dummy patterns 570, 575, 585, and 610 may be arranged in a grid shape in different layers, each of the dummy patterns 570, 575, 585, and 610 may include a central portion CP and an edge portion EP surrounding the central portion CP (see FIGS. 2, 3, 4, 5, and 6). The edge portions EP of dummy patterns which are adjacent to each other in the different layers among the dummy patterns 570, 575, 585, and 610 may overlap each other along a third direction D3 perpendicular to the first direction D1 and the second direction D2. In other words, central portions CP of the dummy patterns which are adjacent to each other in the different layers among the dummy patterns 570, 575, 585, and 610 may not overlap each other. That is, the active patterns 530 and the dummy patterns 570, 575, 585, and 610 may have a waffle shape with a plurality of grooves. For example, the first side portion 570_1, the second side portion 570_2, the third side portion 570_3, and the fourth side portion 570_4 of the reference dummy pattern 570 may be defined as the edge portions EP of the reference dummy pattern 570, and the remaining portions of the reference dummy pattern 570 except for the first side portion 570_1, the second side portion 570_2, the third side portion 570_3, and the fourth side portion 570_4 may be defined as the central portion CP of the reference dummy pattern 570. In addition, the first side portion 575_1, the second side portion 575_2, the third side portion 575_3, and the fourth side portion 575_4 of the lower dummy pattern 575 may be defined as the edge portions EP of the lower dummy pattern 575, and the remaining portions of the lower dummy pattern 575 except the first side portion 575_1, the second side portion 575_2, the third side portion 575_3, and the fourth side portion 575_4 may be defined as the central portion CP of the lower dummy pattern 575. Similarly, each of the active pattern 530, the intermediate dummy pattern 585, and the upper dummy pattern 610 may also have the edge portions EP and the central portions CP, which are defined as described above.

The display device 100 according to the example embodiments of the present disclosure may include the active patterns 530 and the dummy patterns 570, 575, 585, and 610 which are disposed in the peripheral area 20 adjacent to the display area 10. In this case, the semiconductor element 250 formed in the central part of the display area 10 and the semiconductor element 250 formed in the display area 10 which is adjacent to the peripheral area 20 may have substantially the same size, and the semiconductor element 250 formed in the display area 10 which is adjacent to the peripheral area 20 may not have a defect. In addition, the edge portions EP of the dummy patterns which are adjacent to each other in the different layers among the dummy patterns 570, 575, 585, and 610 overlap each other in the third direction D3, so that gaps of insulating layers (e.g., a gate insulating layer 150, a first insulating interlayer 190, a second insulating interlayer 195, and a third insulating interlayer 205 of FIG. 10) that cover the dummy patterns 570, 575, 585, and 610 may not be substantial. Accordingly, residues of a photoresist used in a process of etching the dummy patterns 570, 575, 585, and 610 may not be left, and electrodes (e.g., an active layer 130, a first gate electrode 170, a second gate electrode 175, a third gate electrode 185, a source electrode 210, and a drain electrode 230 of FIG. 10) disposed in the display area 10 may not be shorted by the residues.

Although the dummy patterns 570, 575, 585, and 610 according to the present disclosure have been described as being four patterns, the configuration of the present disclosure is not limited. For example, the number of dummy patterns 570, 575, 585, and 610 may be determined such that the edge portions EP of the dummy patterns which are adjacent to each other in the different layers among the dummy patterns 570, 575, 585, and 610 overlap each other along the third direction D3.

Figure 11:
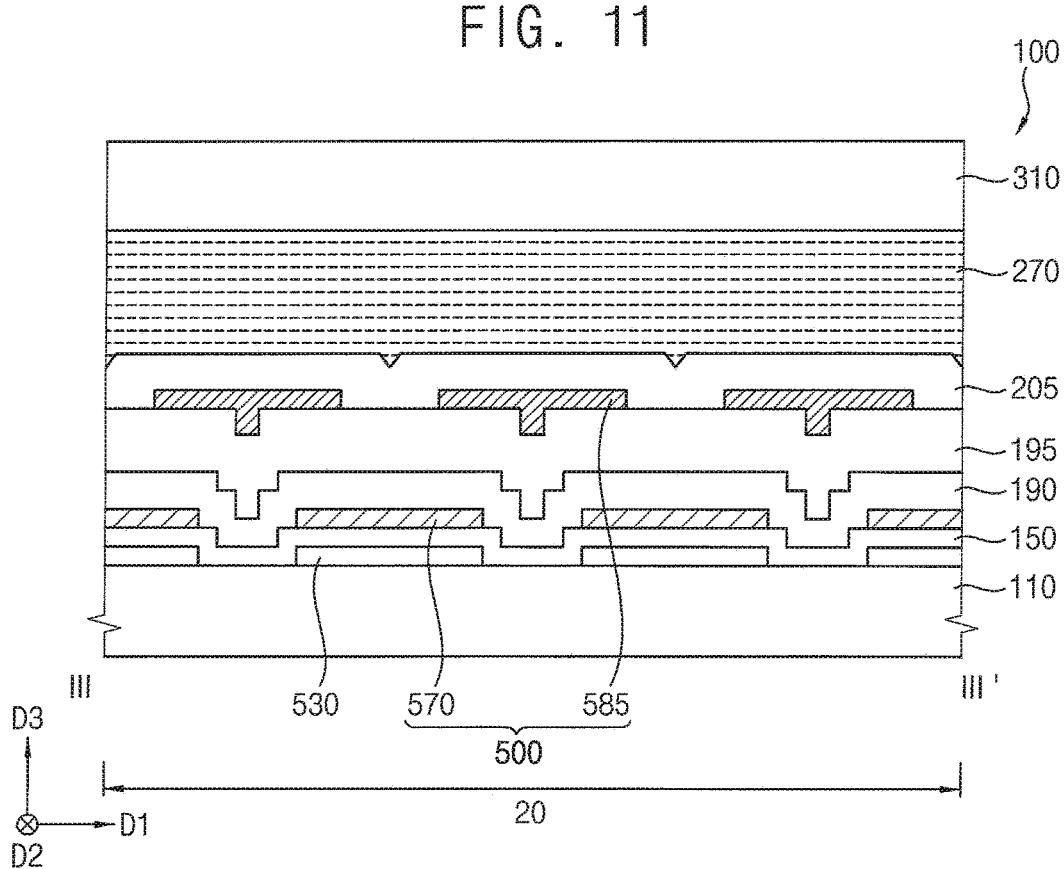
FIG. 11 is a sectional view taken along line III-III' of FIG. 7.
Figure 12:
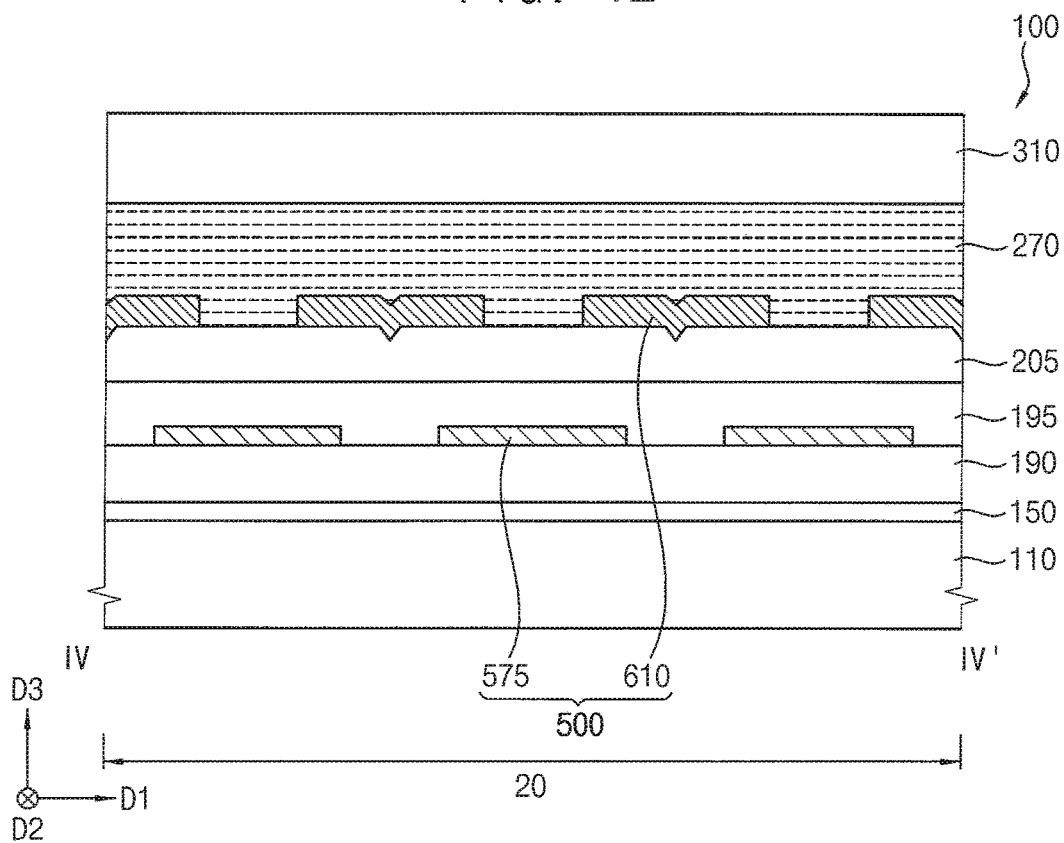
FIG. 12 is a sectional view taken along line IV-IV' of FIG. 7.
Figure 13:
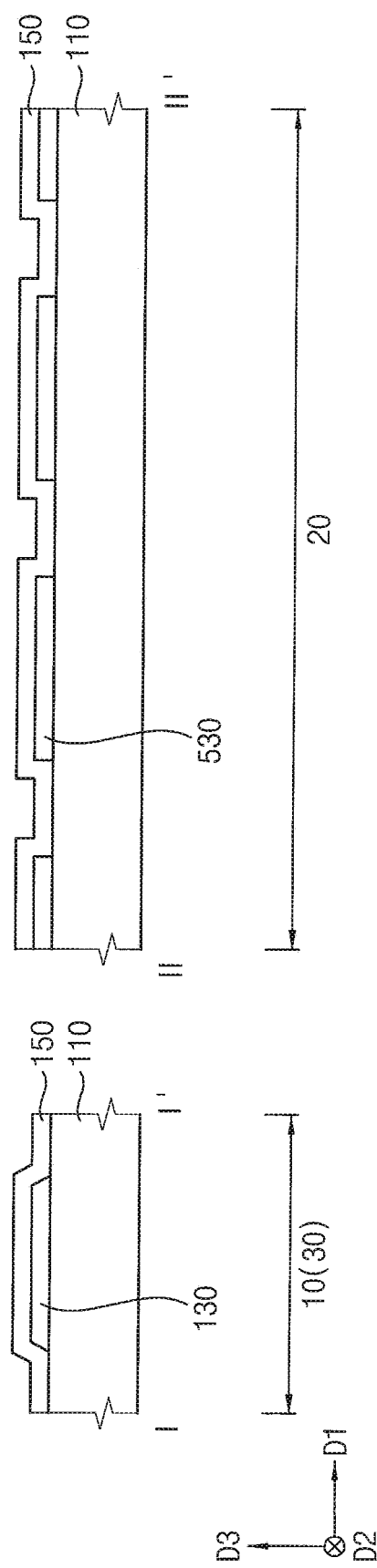
FIGS. 13, 14, 15, 16, 17, 18, 19, 20, 21, 22, 23, 24, 25, 26, 27, 28, and 29 are sectional views showing a method of manufacturing a display device according to example embodiments of the present disclosure.
Figure 14:
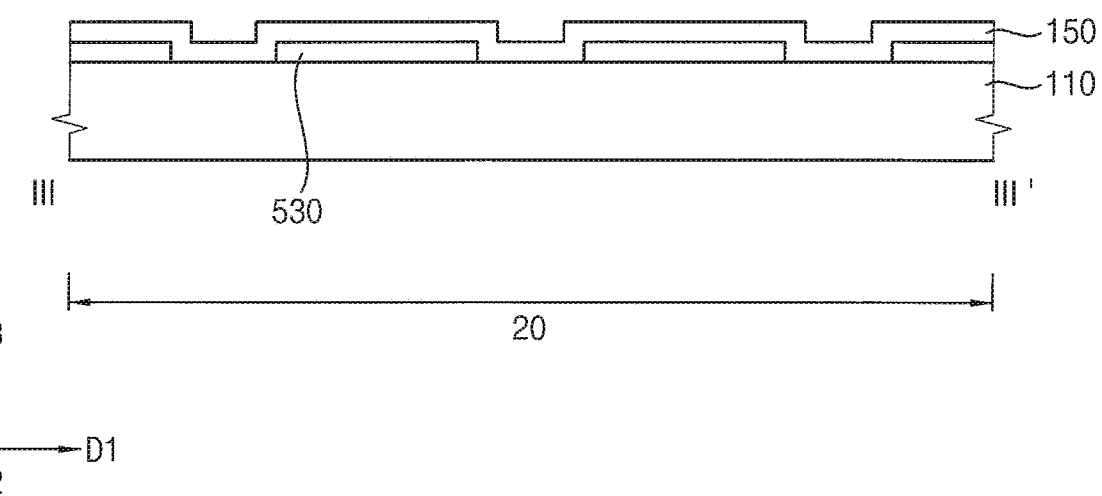
Figure 15:
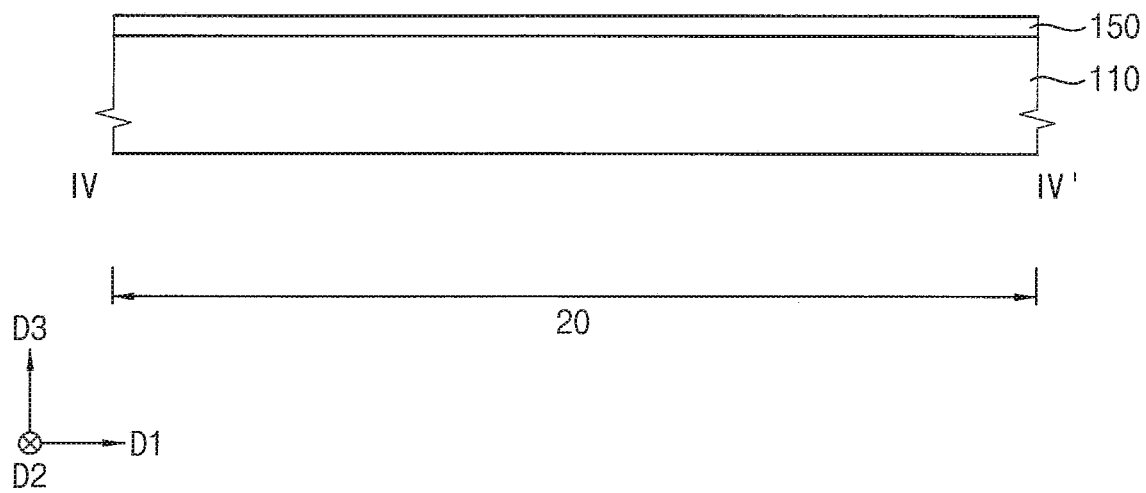
Figure 16:
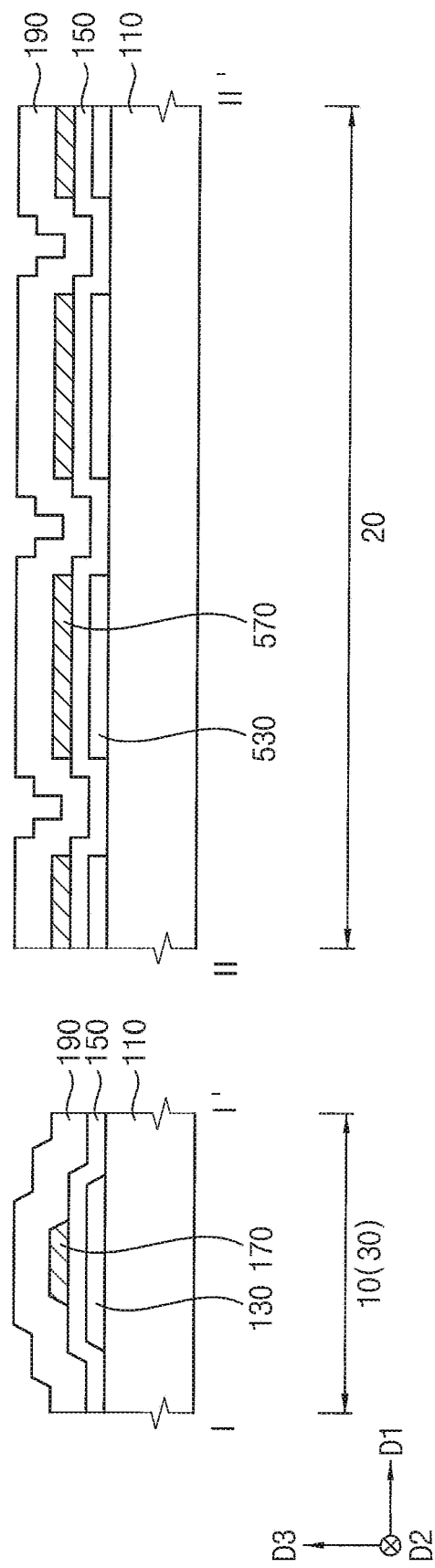
Figure 17:
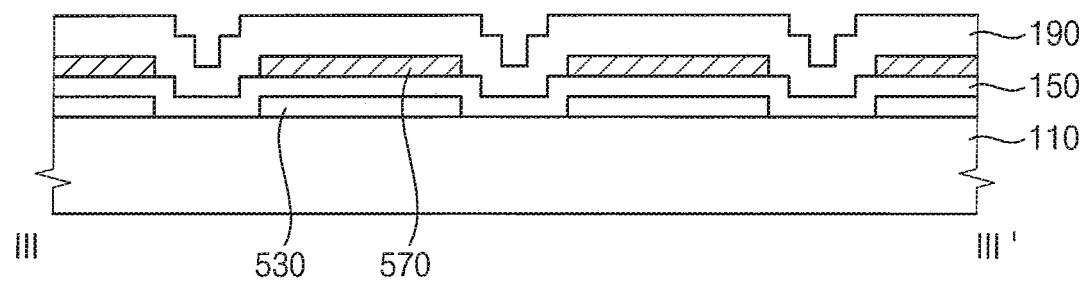
Figure 17:
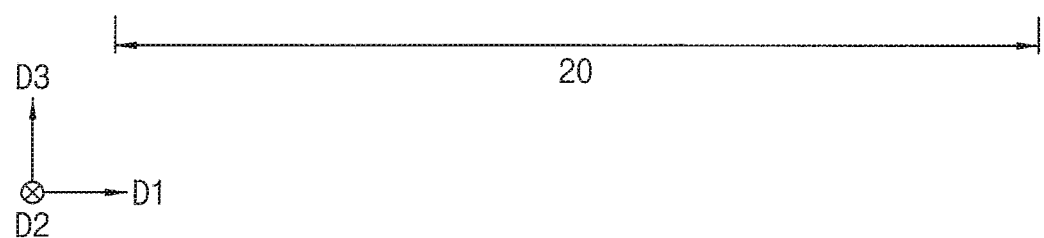
Figure 18:
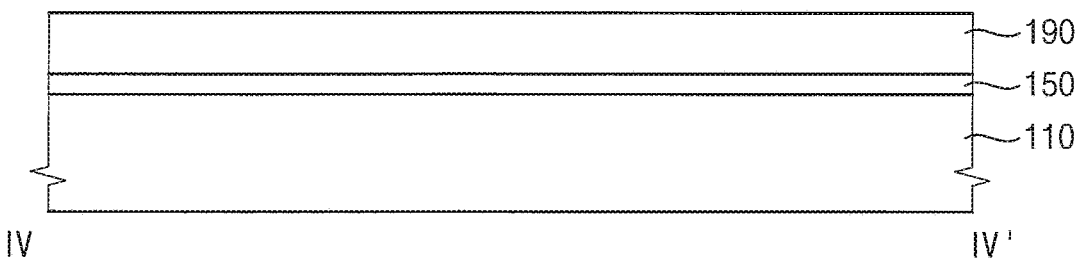
Figure 18:
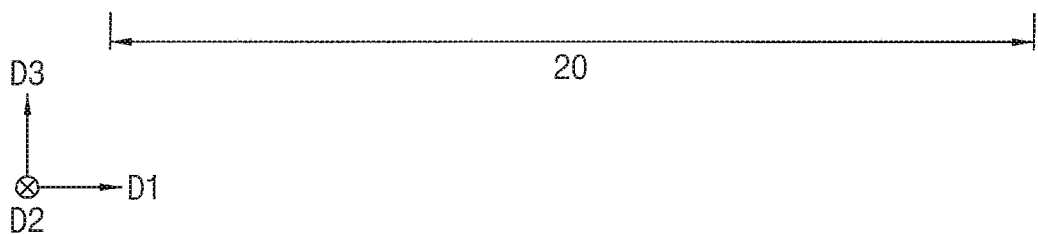
Figure 19:
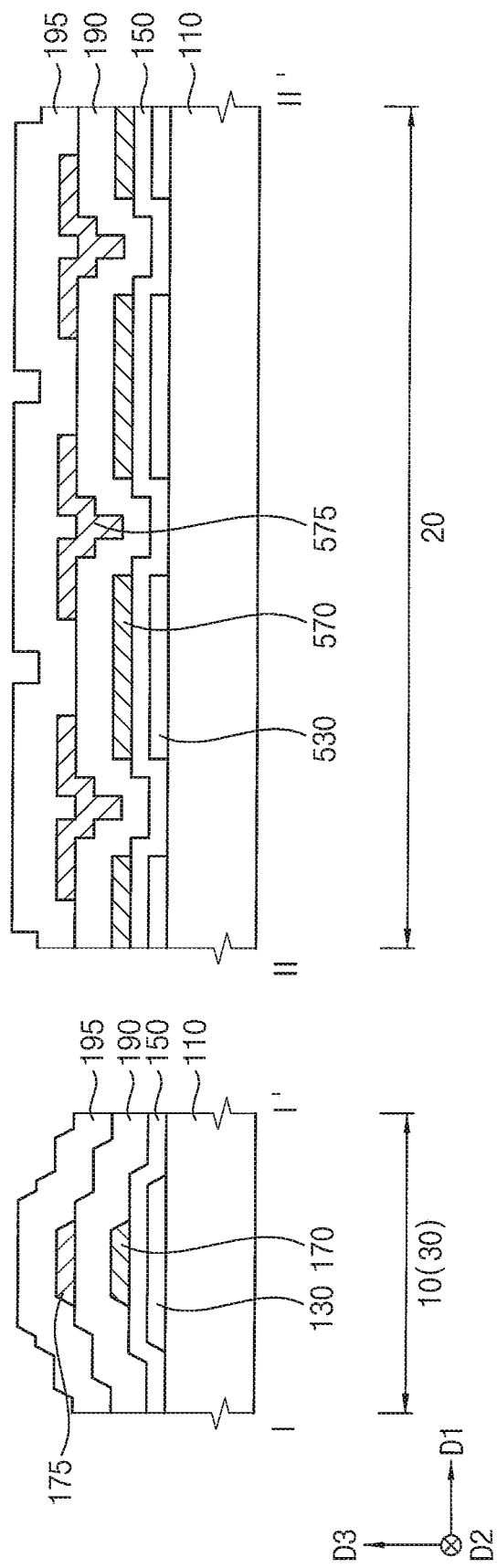
Figure 20:
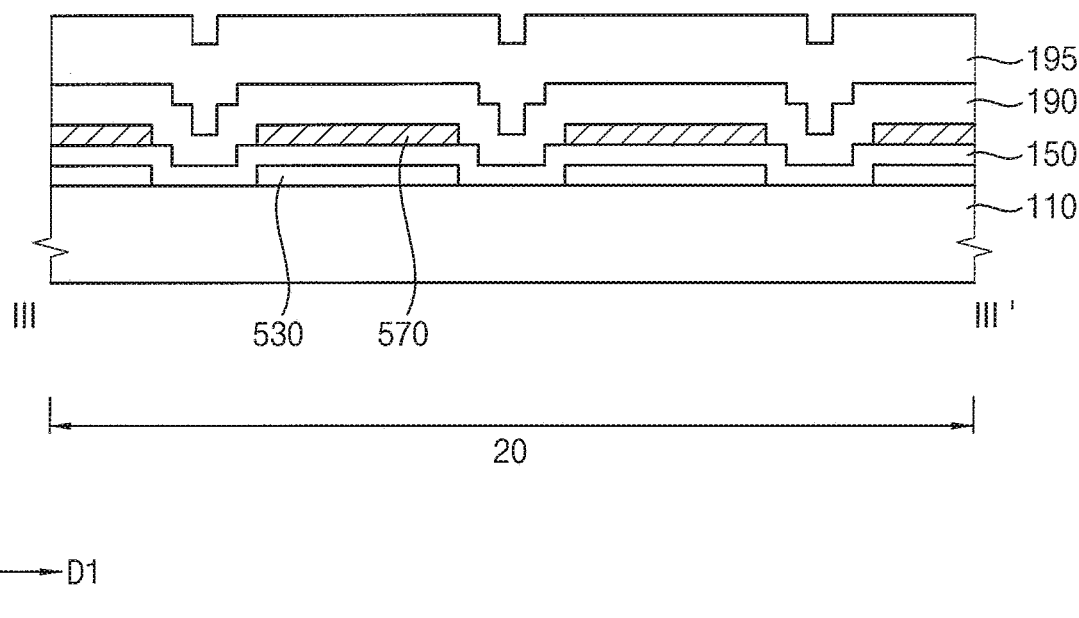
Figure 21:
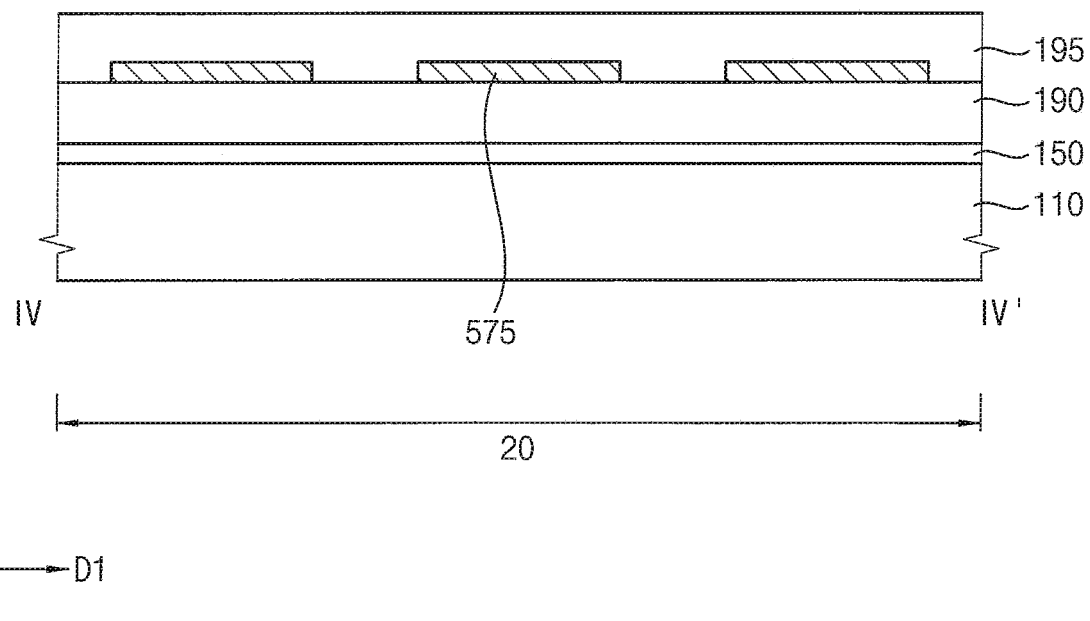
Figure 22:
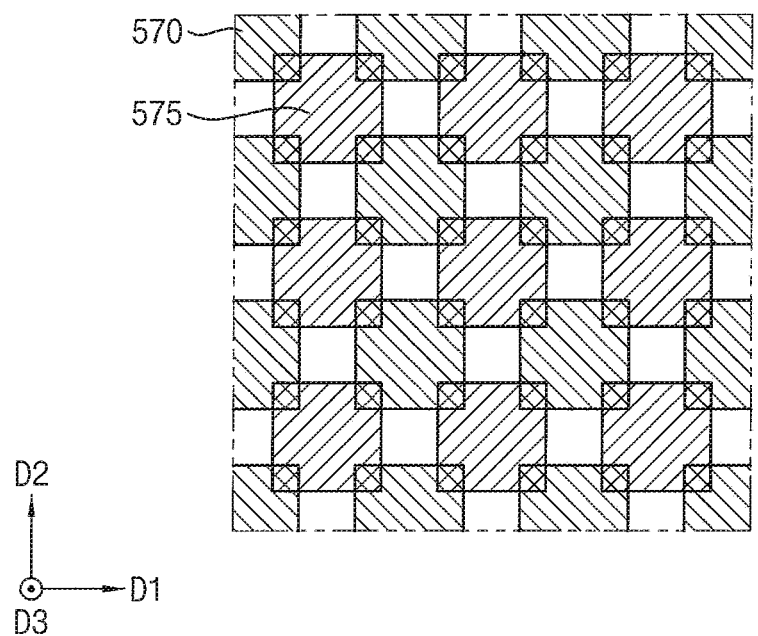
Figure 23:
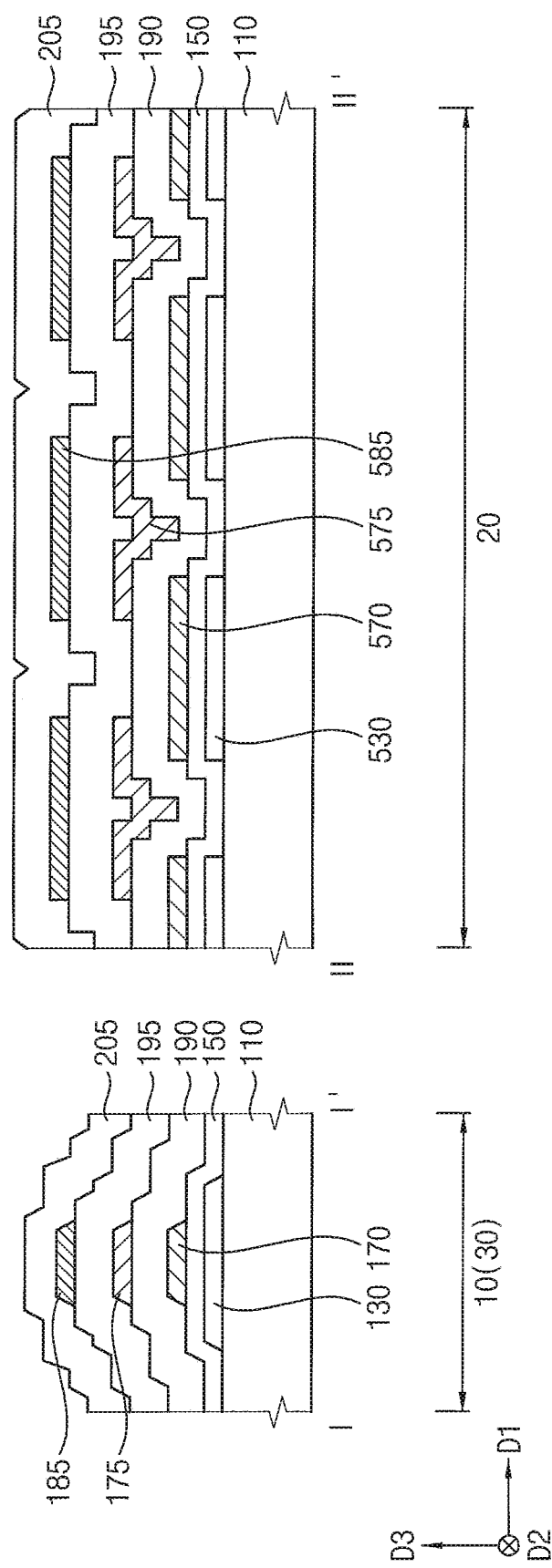
Figure 24:
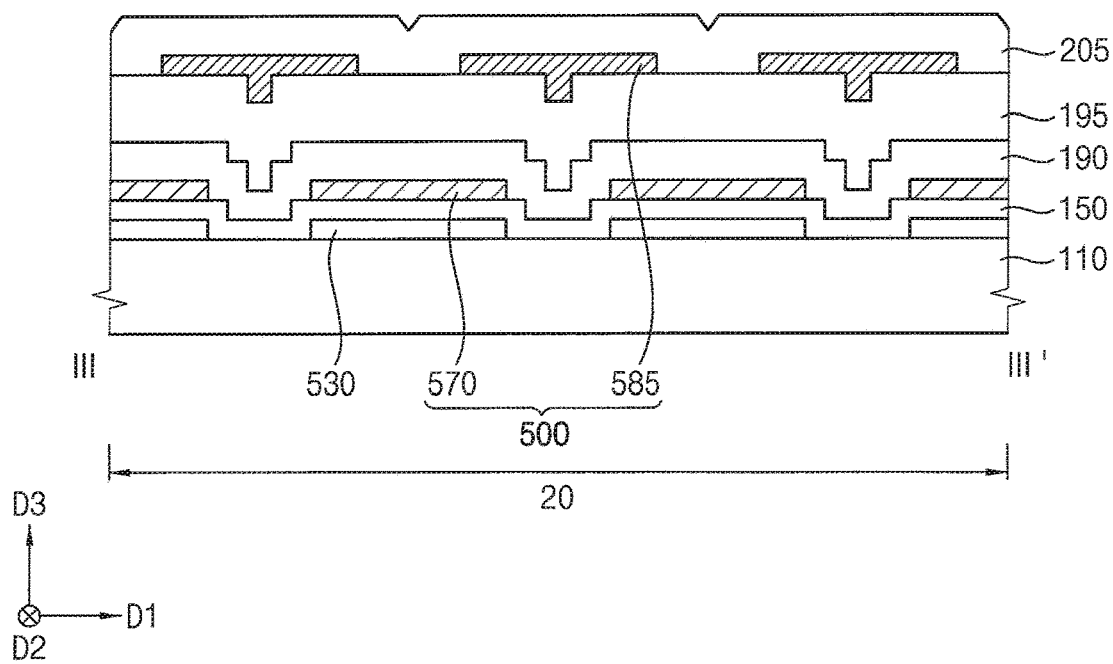
Figure 25:
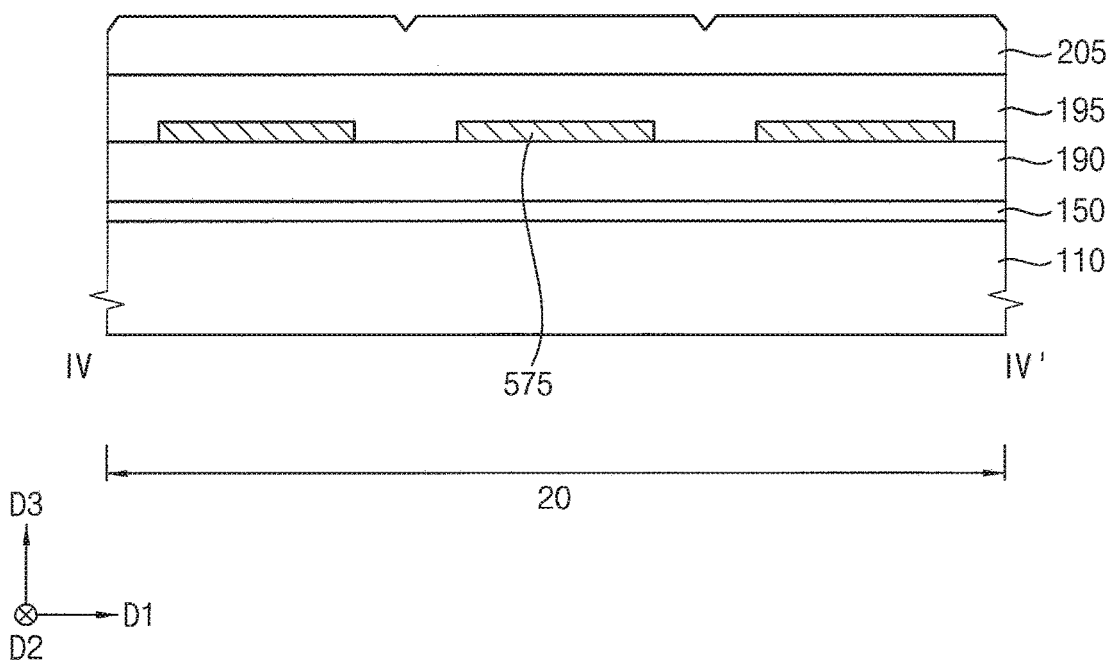
Figure 26:
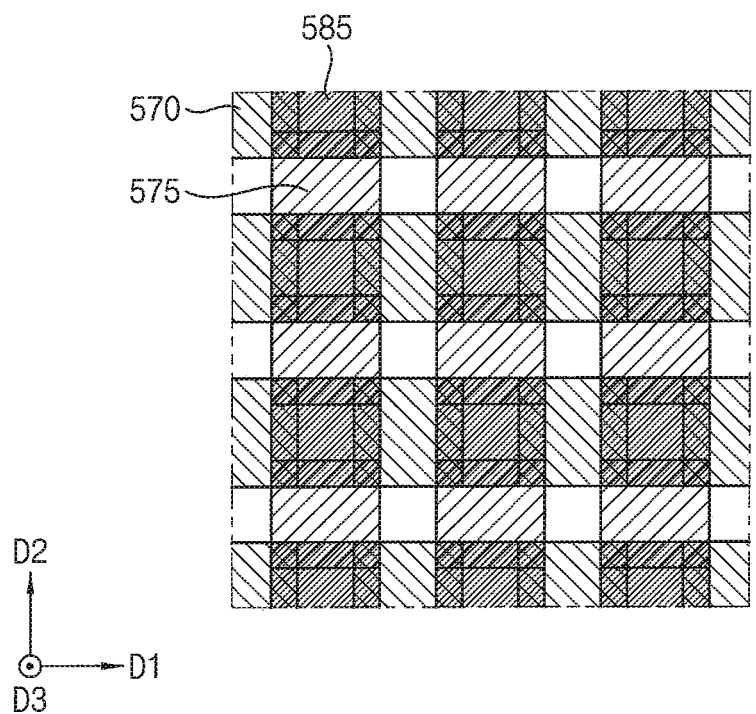
Figure 27:
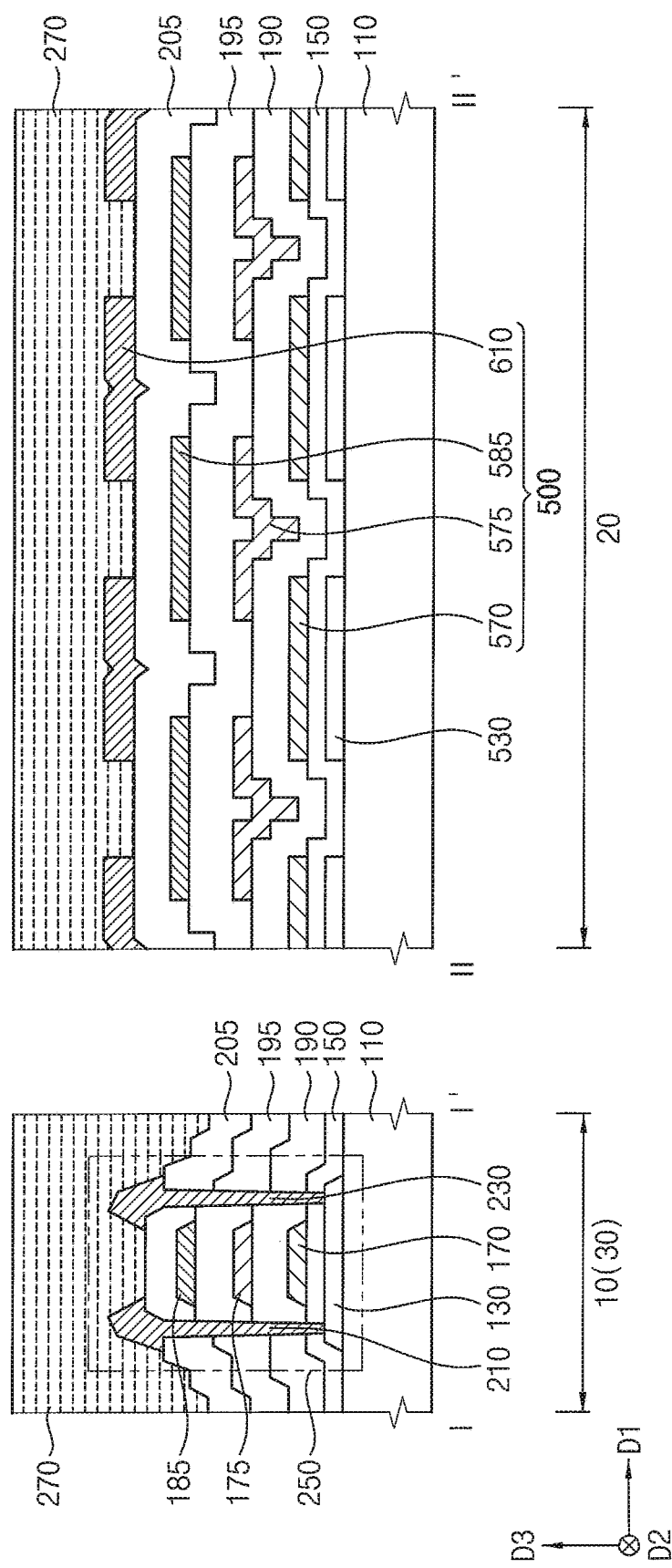
Figure 28:
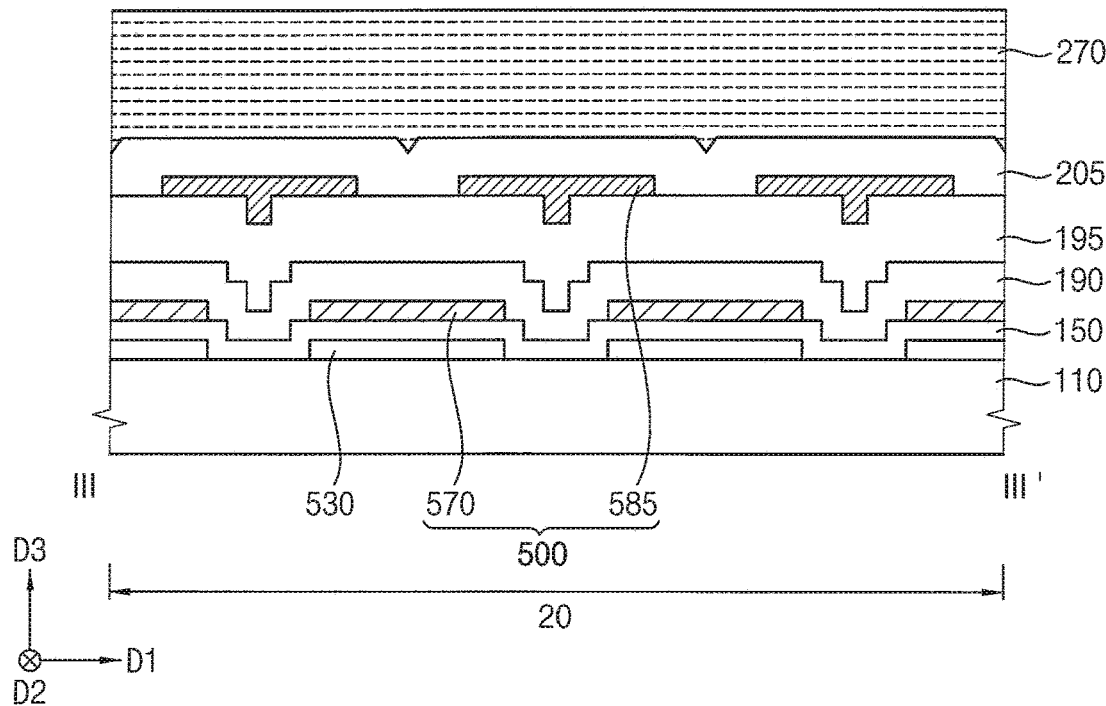
Figure 29:
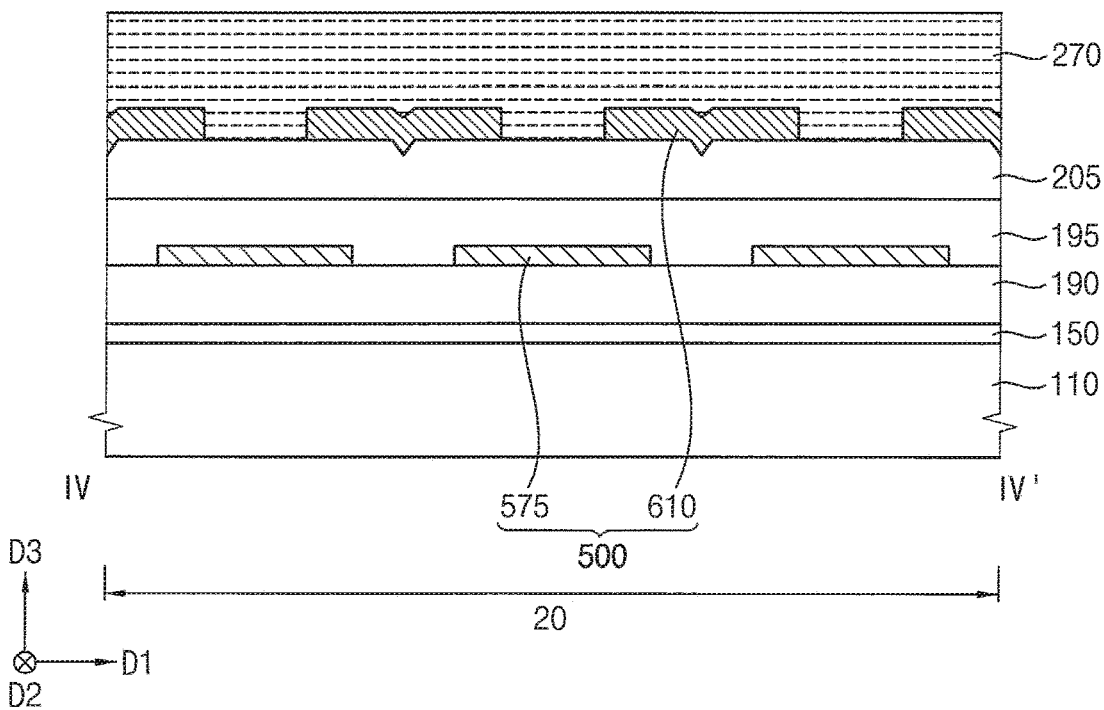

FIG. 10 is a sectional view taken along line I-I' of FIG. 1 and line II-II' of FIG. 7, FIG. 11 is a sectional view taken along line III-III' of FIG. 7, and FIG. 12 is a sectional view taken along line IV-IV' of FIG. 7.

Referring to FIGS. 10, 11, and 12, the display device 100 may include a substrate 110, a semiconductor element 250, a pixel structure 200, a planarization layer 270, a pixel defining layer 310, a dummy pattern structure 500, and active patterns 530. In this case, the semiconductor element 250 may include an active layer 130, a gate insulating layer 150, a first gate electrode 170, a first insulating interlayer 190, a second gate electrode 175, a second insulating interlayer 195, a third gate electrode 185, a third insulating interlayer 205, a source electrode 210, and a drain electrode 230, and the pixel structure 200 may include a lower electrode 290, an organic light emitting layer 330, and an upper electrode 340. In addition, the dummy pattern structure 500 may include reference dummy patterns 570, lower dummy patterns 575, intermediate dummy patterns 585, and upper dummy patterns 610.

The substrate 110 including a transparent or opaque material may be provided. The substrate 110 may include a quartz substrate, a synthetic quartz substrate, a calcium fluoride substrate, a fluorine-doped quartz substrate (F-doped quartz substrate), a soda lime glass substrate, and a non-alkali glass substrate.

In some embodiments, the substrate 110 may be a transparent resin substrate having flexibility. One of Examples of the transparent resin substrate that may be used as the substrate 110 include a polyimide substrate. In this case, the polyimide substrate may include a first polyimide layer, a barrier film layer, and a second polyimide layer. For example, the polyimide substrate may have a configuration in which the first polyimide layer, the barrier film layer, and the second polyimide layer are sequentially stacked on a rigid glass substrate. In a method of manufacturing the display device 100, after an insulating layer (e.g., a buffer layer) is disposed on the second polyimide layer of the polyimide substrate, an upper structure (e.g., the semiconductor element 250, the pixel structure 200, and the like) may be disposed on the insulating layer. After the upper structure is formed, the rigid glass substrate may be removed. In other words, since the polyimide substrate is thin and flexible, it may be difficult to directly form the upper structure on the polyimide substrate. Taking such points into consideration, the upper structure may be formed by using the rigid glass substrate, and then the glass substrate may be removed, so that the polyimide substrate may be used as the substrate 110.

Since the display device 100 includes the display area 10, which includes the pixel area 30, and the peripheral area 20, the substrate 110 may also be divided into a display area 10 (or a pixel area 30) and a peripheral area 20.

A buffer layer (not shown) may be disposed on the substrate 110. The buffer layer may be disposed over the whole of the display area 10 and the peripheral area 20 on the substrate 110. The buffer layer may prevent metal atoms or impurities from diffusing from the substrate 110 to the semiconductor element 250, and may control a heat transfer rate during a crystallization process for forming the active layer 130 and the active patterns 530 to obtain a substantially uniform active layer 130 and substantially uniform active patterns 530. In addition, when a surface of the substrate 110 is not uniform, the buffer layer may serve to improve flatness of the surface of the substrate 110. Depending on a type of the substrate 110, at least two buffer layers may be provided on the substrate 110, or the buffer layer may not be provided. The buffer layer may include an organic insulating material or an inorganic insulating material.

The active layer 130 may be disposed in the display area 10 on the substrate 110. The active layer 130 may include a metal oxide semiconductor, an inorganic semiconductor (e.g., amorphous silicon or poly silicon semiconductor), an organic semiconductor, or the like. The active layer 130 may have a source region, a drain region, and a channel region located between the source region and the drain region.

The active patterns 530 may be disposed in the peripheral area 20 on the substrate 110. The active patterns 530 may be arranged in a grid shape. In the example embodiments, the active patterns 530 may contain the same material as the active layer 130, and may be located on the same layer as the active layer 130.

The gate insulating layer 150 may be disposed on the substrate 110, the active layer 130, and the active patterns 530. The gate insulating layer 150 may extend from the display area 10 to the peripheral area 20 to cover the active layer 130 in the display area 10 on the substrate 110, and may cover the active patterns 530 in the peripheral area 20. For example, the gate insulating layer 150 may be disposed along a profile of the active layer 130 and the active patterns 530 with a uniform thickness to cover the active layer 130 and the active patterns 530 on the substrate 110. In some embodiments, the gate insulating layer 150 may sufficiently cover the active layer 130 in the display area 10 and the active patterns 530 in the peripheral area 20 on the substrate 110, and may have a substantially flat top surface without creating a step around the active layer 130 and the active patterns 530. The gate insulating layer 150 may include a silicon compound and metal oxide. For example, the gate insulating layer 150 may include silicon oxide ($SiO_x$), silicon nitride ($SiN_x$), silicon oxynitride ($SiO_xN_y$), silicon oxycarbide (SiO$_x$C$_y$), silicon carbonitride (SiC$_x$N$_y$), aluminum oxide (AlO$_x$), aluminum nitride (AlN$_x$), tantalum oxide (TaO$_x$), hafnium oxide (HfO$_x$), zirconium oxide (ZrO$_x$), and titanium oxide (TiO$_x$). In other example embodiments, the gate insulating layer 150 may have a multilayer structure having a plurality of insulating layers including mutually different materials.

The first gate electrode 170 may be disposed in the display area 10 on the gate insulating layer 150. The first gate electrode 170 may be disposed at a portion of the gate insulating layer 150 under which the active layer 130 is located (e.g., to overlap the channel region of the active layer 130). The first gate electrode 170 may include a metal, an alloy, metal nitride, conductive metal oxide, and a transparent conductive material. For example, the first gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an aluminum-containing alloy, aluminum nitride (AlN$_x$), a silver-containing alloy, tungsten nitride (WN$_x$), a copper-containing alloy, a molybdenum-containing alloy, titanium nitride (TiN$_x$), chromium nitride (CrN$_x$), tantalum nitride (TaN$_x$), strontium ruthenium oxide (Sr-Ru$_x$O$_y$), zinc oxide (ZnO$_x$), indium tin oxide (ITO), tin oxide (SnO$_y$), indium oxide (InO$_x$), gallium oxide (GaO$_x$), and indium zinc oxide (IZO). These may be used alone or in combination with each other. In other example embodiments, the first gate electrode 170 may have a multilayer structure including a plurality of metal layers. For example, the metal layers may have mutually different thicknesses or may include mutually different materials.

The reference dummy patterns 570 may be disposed in the peripheral area 20 on the gate insulating layer 150. The reference dummy patterns 570 may be arranged in a grid shape. In other words, the reference dummy patterns 570 may be disposed at portions of the gate insulating layer 150 under which the active patterns 530 are located respectively. As shown in FIG. 8, each of the reference dummy patterns 570 may have a first side portion 570_1, a second side portion 570_2, a third side portion 570_3, and a fourth side portion 570_4, both ends of the first side portion 570_1 may include a first corner portion 570_6 and a second corner portion 570_7 respectively, both ends of the second side portion 570_2 may include a third corner portion 570_8 and a fourth corner portion 570_9 respectively, both ends of the third side portion 570_3 may include the first corner portion 570_6 and the third corner portion 570_8 respectively, and both ends of the fourth side portion 570_4 may include the second corner portion 570_7 and the fourth corner portion 570_9 respectively. In the example embodiments, the reference dummy patterns 570 may contain the same material as the first gate electrode 170, and may be located on the same layer as the first gate electrode 170.

The first insulating interlayer 190 may be disposed on the gate insulating layer 150, the first gate electrode 170, and the reference dummy patterns 570. The first insulating interlayer 190 may extend from the display area 10 to the peripheral area 20 to cover the first gate electrode 170 in the display area 10 on the gate insulating layer 150, and may cover the reference dummy patterns 570 in the peripheral area 20. For example, the first insulating interlayer 190 may be disposed along a profile of the first gate electrode 170 and the reference dummy patterns 570 with a uniform thickness to cover the first gate electrode 170 and the reference dummy patterns 570 on the gate insulating layer 150. In some embodiments, the first insulating interlayer 190 may sufficiently cover the first gate electrode 170 and the reference dummy patterns 570 on the gate insulating layer 150, and may have a substantially flat top surface without creating a step around the first gate electrode 170 and the reference dummy patterns 570. The first insulating interlayer 190 may include a silicon compound, metal oxide, and the like. In other example embodiments, the first insulating interlayer 190 may have a multilayer structure having a plurality of insulating layers including mutually different materials.

The second gate electrode 175 may be disposed in the display area 10 on the first insulating interlayer 190. The second gate electrode 175 may be disposed at a portion of the first insulating interlayer 190 under which the first gate electrode 170 is located. The second gate electrode 175 may include a metal, an alloy, metal nitride, conductive metal oxide, and a transparent conductive material. These may be used alone or in combination with each other. In other example embodiments, the second gate electrode 175 may have a multilayer structure including a plurality of metal layers. For example, the metal layers may have mutually different thicknesses or may include mutually different materials.

The lower dummy patterns 575 may be disposed in the peripheral area 20 on the first insulating interlayer 190. The lower dummy patterns 575 may be arranged in a grid shape. In other words, each of the lower dummy patterns 575 may partially overlap the reference dummy patterns 570 at portions of the first insulating interlayer 190 under which the reference dummy patterns 570 are located. In addition, the lower dummy patterns 575 may overlap the first corner portion 570_6, the second corner portion 570_7, the third corner portion 570_8, and the fourth corner portion 570_9 of each of the reference dummy patterns 570. As shown in FIG. 9, each of the lower dummy patterns 575 may have a first side portion 575_1, a second side portion 575_2, a third side portion 575_3, and a fourth side portion 575_4, both ends of the first side portion 575_1 may include a first corner portion 575_6 and a third corner portion 575_8 respectively, both ends of the second side portion 575_2 may include a second corner portion 575_7 and a fourth corner portion 575_9 respectively, both ends of the third side portion 575_3 may include the first corner portion 575_6 and the second corner portion 575_7, respectively and both sides of the fourth side portion 575_4 may include the third corner portion 575_8 and the fourth corner portion 575_9 respectively. In the example embodiments, the lower dummy patterns 575 may contain the same material as the second gate electrode 175, and may be located on the same layer as the second gate electrode 175.

The second insulating interlayer 195 in the display area 10 and the peripheral area 20 may be disposed on the first insulating interlayer 190, the second gate electrode 175, and the lower dummy patterns 575. The second insulating interlayer 195 may extend from the display area 10 to the peripheral area 20 to cover the second gate electrode 175 in the display area 10 on the first insulating interlayer 190, and may cover the lower dummy patterns 575 in the peripheral area 20. For example, the second insulating interlayer 195 may be disposed along a profile of the second gate electrode 175 and the lower dummy patterns 575 with a uniform thickness to cover the second gate electrode 175 and the lower dummy patterns 575 on the first insulating interlayer 190. In some embodiments, the second insulating interlayer 195 may sufficiently cover the second gate electrode 175 and the lower dummy patterns 575 on the first insulating interlayer 190, and may have a substantially flat top surface without creating a step around the second gate electrode 175 and the lower dummy patterns 575. The second insulating interlayer 195 may include a silicon compound and metal oxide. In other example embodiments, the second insulating interlayer 195 may have a multilayer structure having a plurality of insulating layers including mutually different materials.

The third gate electrode 185 may be disposed in the display area 10 on the second insulating interlayer 195. The third gate electrode 185 may be disposed at a portion of the second insulating interlayer 195 under which the second gate electrode 175 is located. The third gate electrode 185 may include a metal, an alloy, metal nitride, conductive metal oxide, and a transparent conductive material. These may be used alone or in combination with each other. In other example embodiments, the third gate electrode 185 may have a multilayer structure including a plurality of metal layers. For example, the metal layers may have mutually different thicknesses or may include mutually different materials.

The intermediate dummy patterns 585 may be disposed in the peripheral area 20 on the second insulating interlayer 195. The intermediate dummy patterns 585 may be arranged in a grid shape. In other words, each of the intermediate dummy patterns 585 may partially overlap the reference dummy patterns 570 and the lower dummy patterns 575 at portions of the second insulating interlayer 195 under which the reference dummy patterns 570 and the lower dummy patterns 575 are located. In addition, the intermediate dummy patterns 585 may overlap the first and second side portions 570_1 and 570_2 of each of the reference dummy patterns 570, and the first and second side portions 575_1 and 575_2 of each of the lower dummy patterns 575. In the example embodiments, the intermediate dummy patterns 585 may contain the same material as the third gate electrode 185, and may be located on the same layer as the third gate electrode 185.

The third insulating interlayer 205 in the display area 10 and the peripheral area 20 may be disposed on the second insulating interlayer 195, the third gate electrode 185, and the intermediate dummy patterns 585. The third insulating interlayer 205 may extend from the display area 10 to the peripheral area 20 to cover the third gate electrode 185 in the display area 10 on the second insulating interlayer 195, and may cover the intermediate dummy patterns 585 in the peripheral area 20. For example, the third insulating interlayer 205 may be disposed along a profile of the third gate electrode 185 and the intermediate dummy patterns 585 with a uniform thickness to cover the third gate electrode 185 and the intermediate dummy patterns 585 on the second insulating interlayer 195. In some embodiments, the third insulating interlayer 205 may sufficiently cover the third gate electrode 185 and the intermediate dummy patterns 585 on the second insulating interlayer 195, and may have a substantially flat top surface without creating a step around the third gate electrode 185 and the intermediate dummy patterns 585. The third insulating interlayer 205 may include a silicon compound and metal oxide. In other example embodiments, the third insulating interlayer 205 may have a multilayer structure having a plurality of insulating layers including mutually different materials.

The source electrode 210 and the drain electrode 230 may be disposed in the display area 10 on the third insulating interlayer 205. The source electrode 210 may be connected to the source region of the active layer 130 through a contact hole formed by removing first portions of the gate insulating layer 150, the first insulating interlayer 190, the second insulating interlayer 195, and the third insulating interlayer 205. The drain electrode 230 may be connected to the drain region of the active layer 130 through a contact hole formed by removing second portions of the gate insulating layer 150, the first insulating interlayer 190, the second insulating interlayer 195, and the third insulating interlayer 205. Each of the source electrode 210 and the drain electrode 230 may include a metal, an alloy, metal nitride, conductive metal oxide, and a transparent conductive material. These may be used alone or in combination with each other. In other example embodiments, each of the source electrode 210 and the drain electrode 230 may have a multilayer structure including a plurality of metal layers. For example, the metal layers may have mutually different thicknesses or may include mutually different materials.

Accordingly, the semiconductor element 250 including the active layer 130, the gate insulating layer 150, the first gate electrode 170, the first insulating interlayer 190, the second gate electrode 175, the second insulating interlayer 195, the third gate electrode 185, the third insulating interlayer 205, the source electrode 210, and the drain electrode 230 may be provided.

Although the semiconductor element 250 has been described as having a top gate structure, the configuration of the present disclosure is not limited. For example, the semiconductor element 250 may have a bottom gate structure.

In addition, although the display device 100 has been described as including one semiconductor element, the configuration of the present disclosure is not limited. For example, the display device 100 may include at least one semiconductor element and at least one storage capacitor.

Moreover, although the semiconductor element 250 has been described as having three gate electrodes, the configuration of the present disclosure is not limited. For example, the semiconductor element 250 may have at least one gate electrode. In this case, the active patterns 530 may overlap one of the first, second, third, and fourth corner portions 570_6, 570_7, 570_8, and 570_9 of each of the reference dummy patterns 570 with partially overlapping the reference dummy patterns 570.

The upper dummy patterns 610 may be disposed in the peripheral area 20 on the third insulating interlayer 205. The upper dummy patterns 610 may be arranged in a grid shape. In other words, each of the upper dummy patterns 610 may partially overlap the reference dummy patterns 570, the lower dummy patterns 575, and the intermediate dummy patterns 585 at portions of the third insulating interlayer 205 under which the reference dummy patterns 570, the lower dummy patterns 575, and the intermediate dummy patterns 585 are located. In addition, the upper dummy patterns 610 may overlap the third and fourth side portions 570_3 and 570_4 of each of the reference dummy patterns 570, the third and fourth side portions 575_3 and 575_4 of each of the lower dummy patterns 575, and the first, second, third, and fourth corner portions of each of the intermediate dummy patterns 585. In the example embodiments, the upper dummy patterns 610 may contain the same material as the source electrode 210 and the drain electrode 230, and may be located on the same layer as the source electrode 210 and the drain electrode 230.

Accordingly, the dummy pattern structure 500 including the reference dummy patterns 570, the lower dummy patterns 575, the intermediate dummy patterns 585, and the upper dummy patterns 610 may be provided.

The planarization layer 270 in the display area 10 and the peripheral area 20 may be disposed on the third insulating interlayer 205, the upper dummy patterns 610, the source electrode 210, and the drain electrode 230. The planarization layer 270 may extend to the peripheral area 20 to cover the source electrode 210 and the drain electrode 230 in the display area 10 on the third insulating interlayer 205, and may cover the upper dummy patterns 610 in the peripheral area 20. The planarization layer 270 may be disposed in the display area 10 and the peripheral area 20 with a relatively thick thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the upper dummy patterns 610, the source electrode 210, and the drain electrode 230 with a uniform thickness in the display area 10 and the peripheral area 20 on the third insulating interlayer 205. The planarization layer 270 may be formed of an organic insulating material or an inorganic insulating material. In the example embodiments, the planarization layer 270 may include an organic insulating material. For example, the planarization layer 270 may include a photoresist, a polyacryl-based resin, a polyimide-based resin, a polyamide-based resin, a siloxane-based resin, an acryl-based resin, and an epoxy-based resin.

The lower electrode 290 may be disposed in the display area 10 on the planarization layer 270. The lower electrode 290 may be connected to the drain electrode 230 through a contact hole formed by removing a part of the planarization layer 270, and the lower electrode 290 may be electrically connected to the semiconductor element 250. The lower electrode 290 may include a metal, an alloy, metal nitride, conductive metal oxide, and a transparent conductive material. These may be used alone or in combination with each other. In other example embodiments, the lower electrode 290 may have a multilayer structure including a plurality of metal layers. For example, the metal layers may have mutually different thicknesses or may include mutually different materials.

The pixel defining layer 310 may extend from the display area 10 to the peripheral area 20 to expose a part of the lower electrode 290 in the display area 10 on the planarization layer 270. In some embodiments, the pixel defining layer 310 may be disposed only in the display area 10 without being disposed in the peripheral area 20. The pixel defining layer 310 may be formed of an organic material or an inorganic material. In the example embodiments, the pixel defining layer 310 may include an organic material.

The organic light emitting layer 330 in the display area 10 may be disposed on the lower electrode 290 which is partially exposed by the pixel defining layer 310. The organic light emitting layer 330 may be formed by using at least one of light emitting materials for emitting different color lights (i.e., red light, green light, blue light, etc.) according to pixels. Alternatively, the organic light emitting layer 330 may be formed by stacking a plurality of light emitting materials for generating different color lights such as red light, green light, and blue light to emit white light as a whole. In this case, a color filter may be disposed on the organic light emitting layer 330. The color filter may include at least one of a red color filter, a green color filter, and a blue color filter. In some embodiments, the color filter may include a yellow color filter, a cyan color filter, and a magenta color filter. The color filter may include a photo-sensitive resin or a color photoresist.

The upper electrode 340 may be disposed in the display area 10 on the pixel defining layer 310 and the organic light emitting layer 330. The upper electrode 340 may include a metal, an alloy, metal nitride, conductive metal oxide, and a transparent conductive material. These may be used alone or in combination with each other. In other example embodiments, the upper electrode 340 may have a multilayer structure including a plurality of metal layers. For example, the metal layers may have mutually different thicknesses or may include mutually different materials.

Accordingly, the pixel structure 200 including the lower electrode 290, the organic light emitting layer 330, and the upper electrode 340 may be provided.

An encapsulation substrate (not shown) may be disposed on the upper electrode 340 in the display area 10. The encapsulation substrate may face the substrate 110. The encapsulation substrate may include substantially the same material as the substrate 110. For example, the encapsulation substrate may include a quartz substrate, a synthetic quartz substrate, a calcium fluoride substrate, an F-doped quartz substrate, a soda lime glass substrate, and a non-alkali glass substrate. In other example embodiments, the encapsulation substrate may be replaced by a thin film encapsulation structure in which at least one inorganic layer and at least one organic layer are alternately stacked in order to improve flexibility of the display device 100. In this case, the thin film encapsulation structure may include a first inorganic insulating layer, an organic insulating layer, and a second inorganic insulating layer. For example, the first inorganic insulating layer having flexibility may be disposed along a profile of the upper electrode 340, the organic insulating layer having flexibility may be disposed on the first inorganic insulating layer, and the second inorganic insulating layer having flexibility may be disposed on the organic insulating layer.

The display device 100 according to the example embodiments of the present disclosure includes the active patterns 530 and the dummy pattern structure 500 which are disposed in the peripheral area 20 adjacent to the display area 10 so that gaps between the gate insulating layer 150, the first insulating interlayer 190, the second insulating interlayer 195, and the third insulating interlayer 205 may not be substantial. Accordingly, residues of the photoresist used in the process of etching each of the active patterns 530, the reference dummy patterns 570, the lower dummy patterns 575, the intermediate dummy patterns 585, and the upper dummy patterns 610 may not be left, and the active layer 130, the first gate electrode 170, the second gate electrode 175, the third gate electrode 185, the source electrode 210, and the drain electrode 230, which are disposed in the display area 10, may not be shorted by the residues.

Although the display device 100 according to the present disclosure has been described as being an organic light emitting diode display device, the configuration of the present disclosure is not limited. In other example embodiments, the display device 100 may include a liquid crystal display device (LCD), a field emission display device (FED), a plasma display device (PDP), or an electrophoretic image display device (EPD).

FIGS. 13, 14, 15, 16, 17, 18, 19, 20, 21, 22, 23, 24, 25, 26, 27, 28, and 29 are sectional views showing a method of manufacturing a display device according to example embodiments of the present disclosure.

Referring to FIGS. 2, 13, 14, and 15, a substrate 110 including a transparent or opaque material may be provided. The substrate 110 may be formed by using a quartz substrate, a synthetic quartz substrate, a calcium fluoride substrate, an F-doped quartz substrate, a soda lime glass substrate, and a non-alkali glass substrate. The substrate 110 may be divided into a display area 10 and a peripheral area 20.

The active layer 130 may be formed in the display area 10 on the substrate 110. The active layer 130 may be formed by using a metal oxide semiconductor, an inorganic semiconductor, or an organic semiconductor. The active layer 130 may have a source region, a drain region, and a channel region located between the source region and the drain region.

The active patterns 530 may be formed in the peripheral area 20 on the substrate 110. The active patterns 530 may be arranged in a grid shape. In the example embodiments, the active patterns 530 may be simultaneously formed with the active layer 130 by using the same material as the active layer 130. For example, after a preliminary active layer is formed over the whole area of the substrate 110, the preliminary active layer may be partially etched to simultaneously form the active layer 130 and the active patterns 530.

The gate insulating layer 150 may be formed over the whole area of the substrate 110, the active layer 130, and the active patterns 530. For example, the gate insulating layer 150 may be formed along the profile of the active layer 130 and the active patterns 530 with a uniform thickness to cover the active layer 130 and the active patterns 530 on the substrate 110. The gate insulating layer 150 may be formed by using a silicon compound, metal oxide, and the like. For example, the gate insulating layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, and $TiO_x$.

Referring to FIGS. 3, 16, 17, and 18, the first gate electrode 170 may be formed in the display area 10 on the gate insulating layer 150. The first gate electrode 170 may be formed at a portion of the gate insulating layer 150 under which the active layer 130 is located. The first gate electrode 170 may be formed by using a metal, an alloy, metal nitride, conductive metal oxide, and a transparent conductive material. For example, the first gate electrode 170 may include Au, Ag, Al, Pt, Ni, Ti, Pd, Mg, Ca, Li, Cr, Ta, W, Cu, Mo, Sc, Nd, Jr, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, and IZO. These may be used alone or in combination with each other.

The reference dummy patterns 570 may be formed in the peripheral area 20 on the gate insulating layer 150. The reference dummy patterns 570 may be arranged in a grid shape. Each of the reference dummy patterns 570 may overlap each of the active patterns 530 respectively. In the example embodiments, the reference dummy patterns 570 may be simultaneously formed with the first gate electrode 170 by using the same material as the first gate electrode 170. For example, after a first preliminary electrode layer is formed over the whole area of the gate insulating layer 150, the first preliminary electrode layer may be partially etched to simultaneously form the first gate electrode 170 and the reference dummy patterns 570.

The first insulating interlayer 190 may be formed over the whole area of the gate insulating layer 150, the first gate electrode 170, and the reference dummy patterns 570. For example, the first insulating interlayer 190 may be formed along the profile of the first gate electrode 170 and the reference dummy patterns 570 with a uniform thickness to cover the first gate electrode 170 and the reference dummy patterns 570 on the gate insulating layer 150. The first insulating interlayer 190 may be formed by using a silicon compound, and metal oxide.

Referring to FIGS. 19, 20, 21, and 22, the second gate electrode 175 may be formed in the display area 10 on the first insulating interlayer 190. The second gate electrode 175 may be formed at a portion of the first insulating interlayer 190 under which the first gate electrode 170 is located. The second gate electrode 175 may be formed by using a metal, an alloy, metal nitride, conductive metal oxide, and a transparent conductive material. These may be used alone or in combination with each other.

The lower dummy patterns 575 may be formed in the peripheral area 20 on the first insulating interlayer 190. The lower dummy patterns 575 may be arranged in a grid shape. Each of the lower dummy patterns 575 may partially overlap the reference dummy patterns 570. In the example embodiments, the lower dummy patterns 575 may be simultaneously formed with the second gate electrode 175 by using the same material as the second gate electrode 175. For example, after a second preliminary electrode layer is formed over the whole area of the first insulating interlayer 190, the second preliminary electrode layer may be partially etched to simultaneously form the second gate electrode 175 and the lower dummy patterns 575.

The second insulating interlayer 195 may be formed over the whole area of the first insulating interlayer 190, the second gate electrode 175, and the lower dummy patterns 575. For example, the second insulating interlayer 195 may be formed along the profile of the second gate electrode 175 and the lower dummy patterns 575 with a uniform thickness to cover the second gate electrode 175 and the lower dummy patterns 575 on the first insulating interlayer 190. The second insulating interlayer 195 may be formed by using a silicon compound and metal oxide.

Referring to FIGS. 23, 24, 25, and 26, the third gate electrode 185 may be formed in the display area 10 on the second insulating interlayer 195. The third gate electrode 185 may be formed at a portion of the second insulating interlayer 195 under which the second gate electrode 175 is located. The third gate electrode 185 may be formed by using a metal, an alloy, metal nitride, conductive metal oxide, and a transparent conductive. These may be used alone or in combination with each other.

The intermediate dummy patterns 585 may be formed in the peripheral area 20 on the second insulating interlayer 195. The intermediate dummy patterns 585 may be arranged in a grid shape. Each of the intermediate dummy patterns 585 may partially overlap the reference dummy patterns 570 and the lower dummy patterns 575. In the example embodiments, the intermediate dummy patterns 585 may be simultaneously formed with the third gate electrode 185 by using the same material as the third gate electrode 185. For example, after a third preliminary electrode layer is formed over the whole area of the second insulating interlayer 195, the third preliminary electrode layer may be partially etched to simultaneously form the third gate electrode 185 and the intermediate dummy patterns 585.

The third insulating interlayer 205 may be formed over the whole area of the second insulating interlayer 195, the third gate electrode 185, and the intermediate dummy patterns 585. For example, the third insulating interlayer 205 may be formed along the profile of the third gate electrode 185 and the intermediate dummy patterns 585 with a uniform thickness to cover the third gate electrode 185 and the intermediate dummy patterns 585 on the second insulating interlayer 195. The third insulating interlayer 205 may be formed by using a silicon compound and metal oxide.

Referring to FIGS. 7, 27, 28, and 29, the source electrode 210 and the drain electrode 230 may be formed in the display area 10 on the third insulating interlayer 205. The source electrode 210 may be connected to the source region of the active layer 130 through a contact hole formed by removing first portions of the gate insulating layer 150, the first insulating interlayer 190, the second insulating interlayer 195, and the third insulating interlayer 205, and the drain electrode 230 may be connected to the drain region of the active layer 130 through a contact hole formed by removing second portions of the gate insulating layer 150, the first insulating interlayer 190, the second insulating interlayer 195, and the third insulating interlayer 205. Each of the source electrode 210 and the drain electrode 230 may be formed by using a metal, an alloy, metal nitride, conductive metal oxide, and a transparent conductive material. These may be used alone or in combination with each other.

Accordingly, the semiconductor element 250 including the active layer 130, the gate insulating layer 150, the first gate electrode 170, the first insulating interlayer 190, the second gate electrode 175, the second insulating interlayer 195, the third gate electrode 185, the third insulating interlayer 205, the source electrode 210, and the drain electrode 230 may be formed.

The upper dummy patterns 610 may be formed in the peripheral area 20 on the third insulating interlayer 205. The upper dummy patterns 610 may be arranged in a grid shape. Each of the upper dummy patterns 610 may partially overlap the reference dummy patterns 570, the lower dummy patterns 575, and the intermediate dummy patterns 585. In the example embodiments, the upper dummy patterns 610 may be simultaneously formed with the source electrode 210 and the drain electrode 230 by using the same material as the source electrode 210 and the drain electrode 230. For example, after a fourth preliminary electrode layer is formed over the whole area of the third insulating interlayer 205, the fourth preliminary electrode layer may be partially etched to simultaneously form the source electrode 210, the drain electrode 230, and the upper dummy patterns 610.

Accordingly, the dummy pattern structure 500 including the reference dummy patterns 570, the lower dummy patterns 575, the intermediate dummy patterns 585, and the upper dummy patterns 610 may be formed.

The planarization layer 270 may be formed over the whole area of the third insulating interlayer 205, the upper dummy patterns 610, the source electrode 210, and the drain electrode 230. The planarization layer 270 may be formed in the display area 10 and the peripheral area 20 with a relatively thick thickness. In this case, the planarization layer 270 may have a substantially flat top surface. In order to implement such a flat top surface of the planarization layer 270, a planarization process may be additionally performed on the planarization layer 270. The planarization layer 270 may be formed by using an organic insulating material. For example, the planarization layer 270 may include a photoresist, a polyacryl-based resin, a polyimide-based resin, a polyamide-based resin, a siloxane-based resin, an acryl-based resin, and an epoxy-based resin.

Referring to FIG. 10, the lower electrode 290 may be formed in the display area 10 on the planarization layer 270. The lower electrode 290 may be formed by using a metal, an alloy, metal nitride, conductive metal oxide, and a transparent conductive material. These may be used alone or in combination with each other.

The pixel defining layer 310 may extend from the display area 10 to the peripheral area 20 to expose a part of the lower electrode 290 in the display area 10 on the planarization layer 270. The pixel defining layer 310 may be formed by using an organic insulating material. [126] The organic light emitting layer 330 may be formed on the lower electrode 290 which is partially exposed by the pixel defining layer 310. The organic light emitting layer 330 may be formed by using at least one of light emitting materials for emitting different color lights (i.e., red light, green light, blue light, etc.) according to pixels. Alternatively, the organic light emitting layer 330 may be formed by stacking a plurality of light emitting materials for generating different color lights such as red light, green light, and blue light to emit white light as a whole.

The upper electrode 340 may be formed in the display area 10 on the pixel defining layer 310 and the organic light emitting layer 330. The upper electrode 340 may be formed by using a metal, an alloy, metal nitride, conductive metal oxide, and a transparent conductive material. These may be used alone or in combination with each other.

Accordingly, the pixel structure 200 including the lower electrode 290, the organic light emitting layer 330, and the upper electrode 340 may be formed.

The encapsulation substrate (not shown) may be formed on the upper electrode 340. The encapsulation substrate may face the substrate 110. The encapsulation substrate may be formed by using substantially the same material as the substrate 110.

As described above, the display device 100 shown in FIGS. 1, 2, 3, 4, 5, 6, 7, 8, 9, and 10 may be manufactured.

In the method of manufacturing the display device 100 according to example embodiments of the present disclosure, the active patterns 530 and the dummy pattern structure 500 which are formed in the peripheral area 20 adjacent to the display area 10 have a waffle shape with a plurality of grooves so that the gaps of the gate insulating layer 150, the first insulating interlayer 190, the second insulating interlayer 195, and the third insulating interlayer 205 may not be substantial. Accordingly, residues of the photoresist used in the process of etching each of the active patterns 530, the reference dummy patterns 570, the lower dummy patterns 575, the intermediate dummy patterns 585, and the upper dummy patterns 610 may not be left in the steps. Therefore, when the active layer 130, the first gate electrode 170, the second gate electrode 175, the third gate electrode 185, the source electrode 210, and the drain electrode 230 are formed in the display area 10, a defect caused by the residues may not occur.

For example, when the residues of the photoresist is left in the gaps, the residues may move to the display area 10 in the manufacturing process so as to prevent the formation of the active layer 130, the first gate electrode 170, the second gate electrode 175, the third gate electrode 185, the source electrode 210, and the drain electrode 230. In this case, the active layer 130, the first gate electrode 170, the second gate electrode 175, the third gate electrode 185, the source electrode 210, and the drain electrode 230 may be shorted by the residues.

The present disclosure may be applied to various electronic devices including a display device. For example, the present disclosure may be applied to vehicle-display device, a ship-display device, an aircraft-display device, portable communication devices, display devices for display or for information transfer, and/or a medical-display device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
a substrate having a display area and a peripheral area;
a semiconductor element disposed in the display area on the substrate;
a pixel structure disposed on the semiconductor element;
a plurality of active patterns disposed in the peripheral area on the substrate; and
a plurality of dummy patterns disposed in the peripheral area on the substrate, the dummy patterns having a stacked structure in a grid shape,
wherein the plurality of dummy patterns comprises a first set of dummy patterns, a second set of dummy patterns, a third set of dummy patterns and a fourth set of dummy patterns, and each of the dummy patterns is disposed in different layers,
wherein each of the dummy patterns includes a central portion,
wherein the central portions of dummy patterns which are adjacent to each other in the different layers are not overlapped each other, and
wherein the plurality of active patterns is disposed between the substrate and the dummy patterns, and at least one of the plurality of active patterns overlaps at least one of the central portions of the first set of dummy patterns.

2. The display device of claim 1, wherein each of the dummy patterns further includes an edge portion surrounding the central portion, and
wherein the edge portions of the dummy patterns which are adjacent to each other in the different layers are overlapped each other in a direction from the substrate to the pixel structure.

3. The display device of claim 1, wherein the plurality of active patterns is arranged in a grid shape and overlaps a part of at least one of the second set of dummy patterns, the third set of dummy patterns and the fourth set of dummy patterns.

4. The display device of claim 1,
wherein the first set of dummy patterns is reference dummy patterns spaced apart from each other at the first interval,
wherein the second set of dummy patterns is lower dummy patterns disposed on the reference dummy patterns, the lower dummy patterns being spaced apart from each other at the first interval, the lower dummy patterns overlapping first, second, third, and fourth corner portions of each of the reference dummy patterns,
wherein the third set of dummy patterns is intermediate dummy patterns disposed on the lower dummy patterns, the intermediate dummy patterns being spaced apart from each other at the first interval, the intermediate dummy patterns overlapping first and second side portions of each of the reference dummy patterns and first and second side portions of each of the lower dummy patterns,
wherein the fourth set of dummy patterns is upper dummy patterns disposed on the intermediate dummy patterns, the upper dummy patterns being spaced apart from each other along the first direction and the second direction, the upper dummy patterns overlapping third and fourth side portions of each of the reference dummy patterns, third and fourth side portions of each of the lower dummy patterns, and first, second, third, and fourth corner portions of each of the intermediate dummy patterns, and
wherein in each of the reference dummy pattern and the lower dummy pattern, the first side portion faces the second side portion, and the third side portion faces the fourth side portion.

5. The display device of claim 4, wherein the reference dummy patterns, the lower dummy patterns, the intermediate dummy patterns, and the upper dummy patterns have a same shape.

6. The display device of claim 4, wherein, in each of the reference dummy patterns,
both ends of the first side portion include the first and second corner portions respectively,
both ends of the second side portion include the third and fourth corner portions respectively,
both ends of the third side portion include the first and third corner portions respectively, and
both ends of the fourth side portion include the second and fourth corner portions respectively.

7. The display device of claim 5, wherein, in each of the lower dummy patterns,
both ends of the first side portion include the first and third corner portions respectively,
both ends of the second side portion include the second and fourth corner portions respectively,
both ends of the third side portion include the first and second corner portions respectively, and
both ends of the fourth side portion include the third and fourth corner portions respectively.

8. The display device of claim 4, wherein the plurality of active patterns is arranged in a grid shape while being spaced apart from each other at the first interval and overlaps a part of at least one of the lower dummy pattern, the intermediate dummy patterns and the upper dummy patterns.

9. The display device of claim 8, wherein the semiconductor element includes:
an active layer disposed on the substrate;
a gate insulating layer disposed on the active layer, which covers the active layer;
a first gate electrode disposed on the gate insulating layer;
a first insulating interlayer disposed on the first gate electrode, which covers the first gate electrode;
a second gate electrode disposed on the first insulating interlayer;
a second insulating interlayer disposed on the second gate electrode, which covers the second gate electrode;
a third gate electrode disposed on the second insulating interlayer;
a third insulating interlayer disposed on the third gate electrode, which covers the third gate electrode; and
source and drain electrodes, both disposed on the third insulating interlayer.

10. The display device of claim 9, wherein the gate insulating layer extends from the display area to the peripheral area on the substrate to cover the plurality of active patterns in the peripheral area on the substrate,
the first insulating interlayer extends from the display area to the peripheral area on the gate insulating layer to cover the reference dummy patterns in the peripheral area on the gate insulating layer, the second insulating interlayer extends from the display area to the peripheral area on the first insulating interlayer to cover the lower dummy patterns in the peripheral area on the first insulating interlayer, and the third insulating interlayer extends from the display area to the peripheral area on the second insulating interlayer to cover the intermediate dummy patterns in the peripheral area on the second insulating interlayer.

11. The display device of claim 9, wherein the active layer is located on a same layer as the plurality of active pattern, the first gate electrode is located on a same layer as the reference dummy patterns, the second gate electrode is located on a same layer as the lower dummy patterns, the third gate electrode is located on a same layer as the intermediate dummy patterns, and the source and drain electrodes are located on a same layer as the upper dummy patterns.

12. The display device of claim 1, wherein the dummy patterns include:

first to $n^{th}$ reference dummy patterns (where n is an integer of 1 or more);

first to $m^{th}$ lower dummy patterns (where m is an integer of 1 or more) disposed on the first to nth reference dummy patterns;

first to $q^{th}$ intermediate dummy patterns (where q is an integer of 1 or more) disposed on the first to $m^{th}$ lower dummy patterns; and first to $p^{th}$ upper dummy patterns (where p is an integer of 1 or more) disposed on the first to $q^{th}$ intermediate dummy patterns, and wherein first, second, third, and fourth corner portions of a $k^{th}$ reference dummy pattern (where k is an integer between 1 and n) among the first to $n^{th}$ reference dummy patterns overlap $j^{th}$, $(j+1)^{th}$, $(j+2)^{th}$, and $(j+3)^{th}$ lower dummy patterns (where j is an integer between 1 and m) among the first to $m^{th}$ lower dummy patterns, $h^{th}$ and $(h+1)^{th}$ intermediate dummy patterns (where h is an integer between 1 and q) among the first to $q^{th}$ intermediate dummy patterns, and $g^{th}$ and $(g+1)^{th}$ upper dummy patterns (where g is an integer between 1 and p) among the first to $p^{th}$ upper dummy patterns.

13. The display device of claim 12, wherein the $g^{th}$ upper dummy pattern is located between the $j^{th}$ and $(j+1)^{th}$ lower dummy patterns, and the $j^{th}$ and $(j+1)^{th}$ lower dummy patterns and the $g^{th}$ upper dummy pattern are located in a same row, the $(g+1)^{th}$ upper dummy pattern is located between the $(j+2)^{th}$ and $(j+3)^{th}$ lower dummy patterns, and the $(j+2)^{th}$ and $(j+3)^{th}$ lower dummy patterns and the $(g+1)^{th}$ upper dummy pattern are located in a same row, and the $k^{th}$ reference dummy pattern is located between the $h^{th}$ and $(h+1)^{th}$ intermediate dummy patterns, and the $h^{th}$ and $(h+1)^{th}$ intermediate dummy patterns and the $k^{th}$ reference dummy pattern are located in a same row.

14. The display device of claim 12, wherein the $h^{th}$ intermediate dummy pattern is located between the $j^{th}$ and $(j+2)^{th}$ lower dummy patterns, and the $j^{th}$ and $(j+2)^{th}$ lower dummy patterns and the $h^{th}$ intermediate dummy pattern are located in a same column, the $k^{th}$ reference dummy pattern is located between the $g^{th}$ and $(g+1)^{th}$ upper dummy patterns, and the $g^{th}$ and $(g+1)^{th}$ upper dummy patterns and the $k^{th}$ reference dummy pattern are located in a same column, and the $(h+1)^{th}$ intermediate dummy pattern is located between the $(j+1)^{th}$ and $(j+3)^{th}$ lower dummy patterns, and the $(j+1)^{th}$ and $(j+3)^{th}$ lower dummy patterns and the $(h+1)^{th}$ intermediate dummy pattern are located in a same column.

15. The display device of claim 12, wherein the $j^{th}$, $(j+1)^{th}$, $(j+2)^{th}$, and $(j+3)^{th}$ lower dummy patterns, the $h^{th}$ and $(h+1)^{th}$ intermediate dummy patterns, and the $g^{th}$ and $(g+1)^{th}$ upper dummy patterns surround the $k^{th}$ reference dummy pattern.

16. The display device of claim 12, wherein first, second, third, and fourth corner portions of a $(k+1)^{th}$ reference dummy pattern located in a same row as the $k^{th}$ reference dummy pattern overlap the $(j+1)^{th}$ and $(j+3)^{th}$ lower dummy patterns, $(j+4)^{th}$ and $(j+5)^{th}$ lower dummy patterns, the $(h+1)^{th}$ intermediate dummy pattern, an $(h+2)^{th}$ intermediate dummy pattern, and $(g+2)^{th}$ and $(g+3)^{th}$ upper dummy patterns.

17. The display device of claim 16, wherein the $(g+2)^{th}$ upper dummy pattern is located between the $(j+1)^{th}$ and $(j+4)^{th}$ lower dummy patterns, and the $j^{th}$, $(j+1)^{th}$, and $(j+4)^{th}$ lower dummy patterns and the $g^{th}$ and $(g+2)^{th}$ upper dummy patterns are located in a same row, the $(g+3)^{th}$ upper dummy pattern is located between the $(j+3)^{th}$ and $(j+5)^{th}$ lower dummy patterns, and the $(j+2)^{th}$, $(j+3)^{th}$, and $(j+5)^{th}$ lower dummy patterns and the $(g+1)^{th}$ and $(g+3)^{th}$ upper dummy patterns are located in a same row, and the $(k+1)^{th}$ reference dummy pattern is located between the $(h+1)^{th}$ and $(h+2)^{th}$ intermediate dummy patterns, and the $h^{th}$, $(h+1)^{th}$, and $(h+2)^{th}$ intermediate dummy patterns and the kth and $(k+1)^{th}$ reference dummy patterns are located in a same row.

18. The display device of claim 16, wherein the $(h+1)^{th}$ intermediate dummy pattern is located between the $(j+1)^{th}$ and $(j+3)^{th}$ lower dummy patterns, and the $(j+1)^{th}$ and $(j+3)^{th}$ lower dummy patterns and the $(h+1)^{th}$ intermediate dummy pattern are located in a same column, the $(k+1)^{th}$ reference dummy pattern is located between the $(g+2)^{th}$ and $(g+3)^{th}$ upper dummy patterns, and the $(g+2)^{th}$ and $(g+3)^{th}$ upper dummy patterns and the $(k+1)^{th}$ reference dummy pattern are located in a same column, and the $(h+2)^{th}$ intermediate dummy pattern is located between the $(j+4)^{th}$ and $(j+5)^{th}$ lower dummy patterns, and the $(j+4)^{th}$ and $(j+5)^{th}$ lower dummy patterns and the $(h+2)^{th}$ intermediate dummy pattern are located in a same column.

19. The display device of claim 16, wherein the $(j+1)^{th}$, $(j+3)^{th}$, $(j+4)^{th}$, and $(j+5)^{th}$ lower dummy patterns, the $(h+1)^{th}$ and $(h+2)^{th}$ intermediate dummy patterns, and the $(g+2)^{th}$ and $(g+3)^{th}$ upper dummy patterns surround the $(k+1)^{th}$ reference dummy pattern.

20. The display device of claim 1, further comprising a planarization layer which covers the semiconductor element and the dummy patterns on the substrate, wherein the pixel structure includes:

a lower electrode disposed in a display area on the planarization layer;

a light emitting layer disposed on the lower electrode; and an upper electrode disposed on the light emitting layer.

* * * * *